US009234953B2

(12) United States Patent
Labadie et al.

(10) Patent No.: US 9,234,953 B2
(45) Date of Patent: Jan. 12, 2016

(54) METHOD AND DEVICE FOR MAGNETIC RESONANCE SPECTROSCOPIC IMAGING

(75) Inventors: Christian Labadie, Saint-Die (FR); Stefan Hetzer, Berlin (DE); Toralf Mildner, Leipzig (DE); Harald Moeller, Leipzig (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 847 days.

(21) Appl. No.: 13/522,696

(22) PCT Filed: Jan. 18, 2010

(86) PCT No.: PCT/EP2010/000254
§ 371 (c)(1),
(2), (4) Date: Aug. 14, 2012

(87) PCT Pub. No.: WO2011/085739
PCT Pub. Date: Jul. 21, 2011

(65) Prior Publication Data
US 2012/0313641 A1 Dec. 13, 2012

(51) Int. Cl.
*G01R 33/56* (2006.01)
*G01R 33/34* (2006.01)
(Continued)

(52) U.S. Cl.
CPC ............ *G01R 33/485* (2013.01); *G01R 33/482* (2013.01); *G01R 33/4818* (2013.01); *G01R 33/5616* (2013.01); *G01R 33/5611* (2013.01)

(58) Field of Classification Search
CPC ............. G01R 33/4818; G01R 33/482; G01R 33/5616; G01R 33/485; G01R 33/5611
USPC ............ 324/307, 309, 318; 382/131; 600/410
See application file for complete search history.

(56) References Cited

U.S. PATENT DOCUMENTS

| 4,480,228 A | 10/1984 | Bottomley |
| 4,689,568 A | 8/1987 | Matsui et al. |

(Continued)

FOREIGN PATENT DOCUMENTS

WO 2010112039 A1 10/2010

OTHER PUBLICATIONS

Adalsteinsson et al., "Three-dimensional spectroscopic imaging with time-varying gradients" Magn. Reson. Med., vol. 33, pp. 461-466 (1995).

(Continued)

*Primary Examiner* — Melissa Koval
*Assistant Examiner* — Rishi Patel
(74) *Attorney, Agent, or Firm* — Caesar Rivise, PC

(57) ABSTRACT

A method of magnetic resonance spectroscopic imaging of an object (O) including at least one chemical species to be imaged, comprising sampling of the k-space such that a plurality of $N_\omega$ first sampling trajectories through at least one k-space segment of the k-space is formed along a phase-encoding direction, each of said first sampling trajectories beginning in a central k-space region and continuing to a k-space border of the at least one k-space segment and having a duration equal to or below a spectral dwell time corresponding to the reciprocal spectral bandwidth, collecting at least one first set of gradient-echo signals obtained along the first sampling trajectories, collecting at least one second set of gradient-echo signals obtained along a plurality of $N_\omega$ second sampling trajectories, the $N_\omega$ second sampling trajectories and the $N_\omega$ first sampling trajectories being mutually mirrored relative to a predetermined k-space line in the central k-space region.

17 Claims, 17 Drawing Sheets

(51) Int. Cl.
*G01R 33/485* (2006.01)
*G01R 33/48* (2006.01)
*G01R 33/561* (2006.01)

(56) References Cited

U.S. PATENT DOCUMENTS

| | | | |
|---|---|---|---|
| 5,709,208 A | 1/1998 | Posse et al. | |
| 8,664,954 B2 * | 3/2014 | Hetzer | G01R 33/4818 324/309 |
| 2009/0091322 A1 | 4/2009 | Posse | |
| 2010/0237865 A1 * | 9/2010 | Stemmer | G01R 33/5611 324/309 |
| 2010/0277172 A1 * | 11/2010 | Takizawa | G01R 33/5616 324/309 |
| 2012/0013336 A1 * | 1/2012 | Hetzer | G01R 33/4818 324/309 |

OTHER PUBLICATIONS

Bernstein et al., "Handbook of MRI Pulse Sequences", Elsevier Academic Press, Amsterdam, Chapters 13.4.2 and 13.4.3, pp. 549-558 (2004).
Bodenhausen et al., "Suppression of Artifacts in Two-Dimensional J Spectroscopy", J. Magn. Reson., vol. 27, pp. 511-514 (1977).
Bowtell et al., "Proton Chemical-Shift Mapping Using PREP", J. Magn. Reson., vol. 82, pp. 634-639 (1989).
Brown, "Time-Domain Combination of MR Spectroscopy Data Acquired Using Phased-Array Coils", Magn. Reson. Med., vol. 52, pp. 1207-1213 (2004).
Brown et al., "NMR chemical shift imaging in three dimensions", Proc. Natl. Acad. Sci. USA, vol. 79, pp. 3523-3526 (1982).
Doyle et al., "Chemical-Shift Imaging: A Hybrid Approach", Magn. Reson. Med., vol. 5, pp. 255-261 (1987).
Ebel et al., "Accelerated 3D Echo-Planar Spectroscopic Imaging at 4 Tesla Using Modified Blipped Phase-Encoding", Magn. Reson. Med., vol. 58, pp. 1061-1066 (2007).
Ernst et al., "Principles of Nuclear Magnetic Resonance in One and Two Dimensions", Clarendon Press, Oxford, chapter 4.2.4, pp. 124-125 (1987).
Felmlee et al., "Spatial Presaturation: A Method for Suppressing Flow Artifacts and Improving Depiction of Vascular Anatomy in MR Imaging", Radiology, vol. 164, pp. 559-564 (1987).
Frahm et al., "Localized Proton Spectroscopy Using Stimulated Echoes", J. Magn. Reson., vol. 72, pp. 502-508 (1987).
Griswold et al., "Generalized Autocalibrating Partially Parallel Acquisitions (GRAPPA)", Magn. Reson. Med., vol. 47, pp. 1202-1210 (2002).
Guilfoyle et al., "Chemical-Shift Imaging", Magn. Reson. Med., vol. 2, pp. 479-489 (1985).
Guilfoyle et al., "PEEP—A Rapid Chemical-Shift Imaging method", Magn. Reson. Med., vol. 10, pp. 282-287 (1989).
Haase et al., "1H NMR chemical shift selective (CHESS) imaging", Phys. Med. Biol., vol. 30, pp. 341-344 (1985).
Hennig, "The Application of Phase Rotation for Localized In Vivo Proton Spectroscopy with Short Echo Times", J. Magn. Reson., vol. 96, pp. 40-49 (1992).
Hetzer et al., "A Modified EPI Sequence for High-Resolution Imaging at Ultra-Short Echo Times", Proc. Intl. Soc. Mag. Reson. Med., vol. 17, p. 2663 (2009).
Man et al., "Multifrequency Interpolation for Fast Off-resonance Correction", Magn. Reson. Med., vol. 37, pp. 785-792 (1997).
Mansfield, "Spatial mapping of the chemical shift in NMR", J. Phys. D: Appl. Phys., vol. 16, pp. L235-L238 (1983).
Mansfield, "Spatial Mapping of the Chemical Shift in NMR", Magn. Reson. Med., vol. 1, pp. 370-386 (1984).
Matsui et al., "High-Speed Spatially Resolved High-Resolution NMR Spectroscopy", J. Am. Chem. Soc., vol. 107, pp. 2817-2818 (1985).
Matsui et al., "High-Speed Spatially Resolved NMR Spectroscopy Using Phase-Modulated Spin-Echo Trains. Expansion of the Spectral Bandwidth by Combined Used of Delayed Spin-Echo Trains", J. Magn. Reson., vol. 64, pp. 167-171 (1985).
Matsui et al., "Spatially Resolved NMR Spectroscopy Using Phase-Modulated Spin-Echo trains", J. Magn. Reson., vol. 67, pp. 476-490 (1986).
Maudsley et al., "Spatially Resolved High Resolution Spectroscopy by "Four-Dimensional" NMR", J. Magn. Reson., vol. 51, pp. 147-152 (1983).
Mulkern et al., "Echo Planar Spectroscopic Imaging", Concepts Magn. Reson., vol. 13, pp. 213-237 (2001).
Noll et al., , "A Homogeneity Correction Method for Magnetic Resonance Imaging with Time-Varying Gradients", IEEE Trans. Med. Imaging, vol. 10, pp. 629-637 (1991).
Oshio et al., "Line Scan Echo Planar Spectroscopic Imaging", Magn. Reson. Med., vol. 44, pp. 521-524 (2000).
Otazo et al., "Signal-to-Noise Ratio and Spectral Linewidth Improvements Between 1.5 and 7 Tesla in Proton Echo-Planar Spectroscopic Imaging", Magn. Reson. Med., vol. 56, pp. 1200-1210 (2006).
Posse et al., "High Speed 1H Spectroscopic Imaging in Human Brain by Echo Planar Spatial-Spectral Encoding", Magn. Reson. Med., vol. 33, pp. 34-40 (1995).
Posse et al., "Three-dimensional Echo-planar MR Spectroscopic Imaging at Short Echo Times in the Human Brain", Radiology, vol. 192, pp. 733-738 (1994).
Posse et al., "Single-Shot Magnetic Resonance Spectroscopic Imaging with Partial Parallel Imaging", Magn. Reson. Med., vol. 61, pp. 541-547 (2009).
Provencher, "Estimation of Metabolite Concentrations from Localized In Vivo Proton NMR Spectra", Magn. Reson. Med., vol. 30, pp. 672-679 (1993).
Pruessmann et al., "SENSE: Sensitivity Encoding for Fast MRI", Magn. Reson. Med., vol. 42, pp. 952-962 (1999).
Schmitt et al., "Echo-Planar Image Reconstruction", In: F. Schmitt, M. K. Stehling, R. Turner, eds. "Echo-Planar Imaging: Theory, Technique and Application", Springer, Berlin, pp. 141-178 (1998).
Tyszka et al., "Volumetric Multishot Echo-Planar Spectroscopic Imaging", Magnetic Resonance in Medicine, vol. 46, No. 2, pp. 219-227 (2001).
Webb et al., "A Fast Spectroscopic Imaging Method Using a Blipped Phase Encode Gradient", Magn. Reson. Med., vol. 12, pp. 306-315 (1989).
International Search Report for PCT/EP2010/000254 dated Oct. 19, 2010.

* cited by examiner

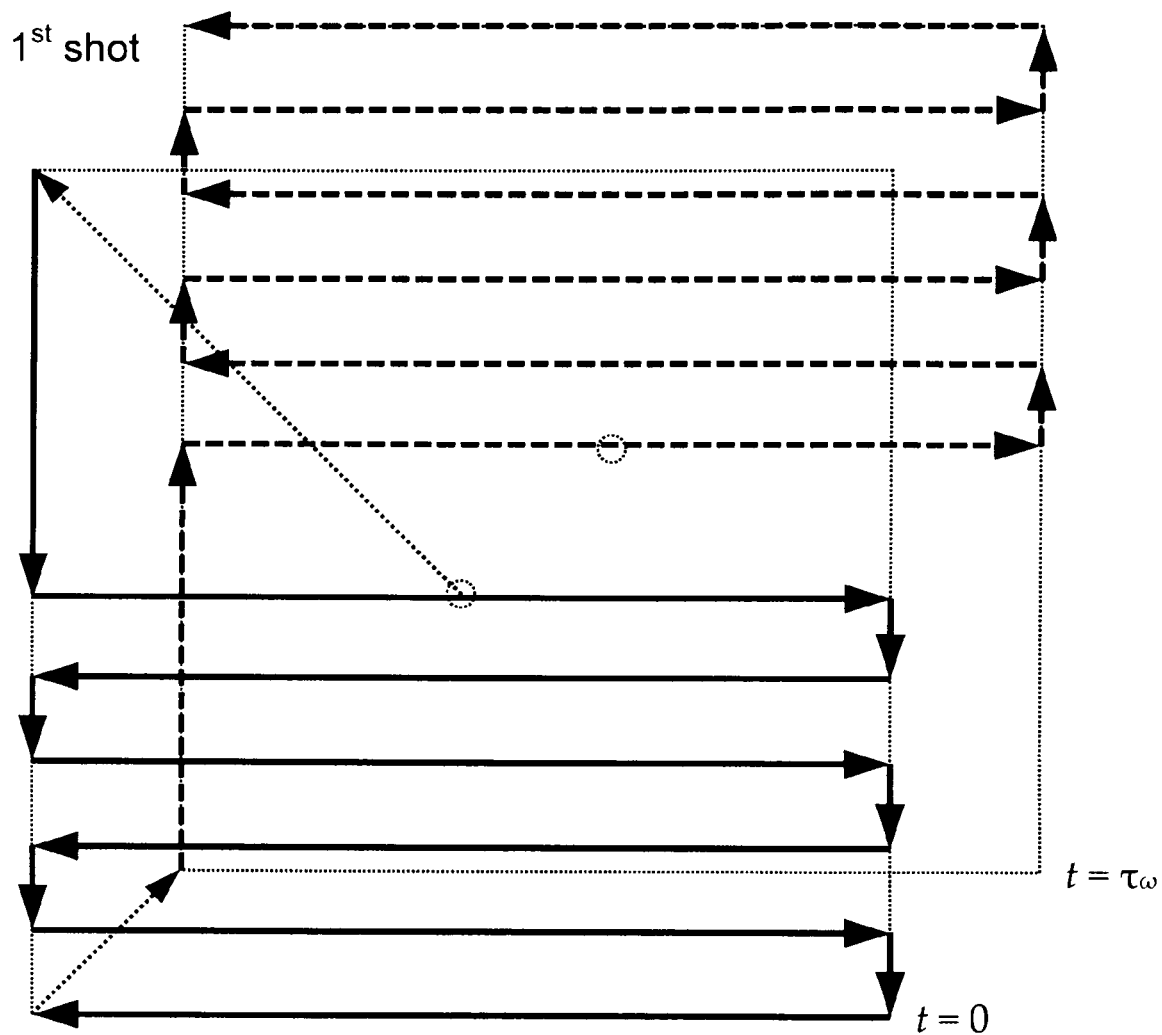
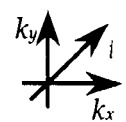
FIG. 1B

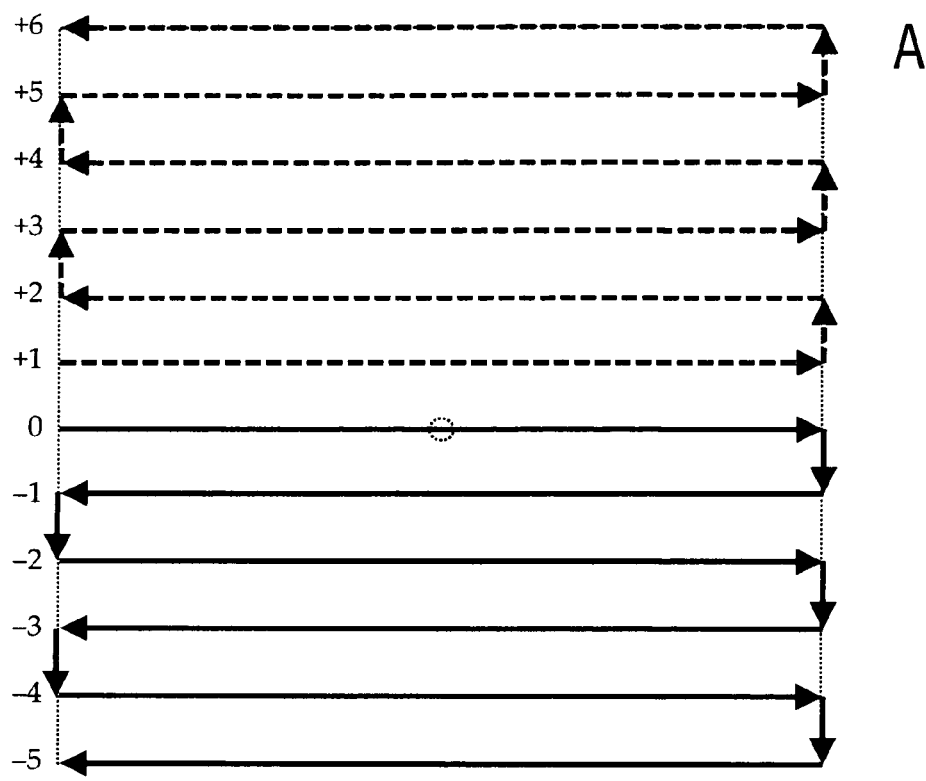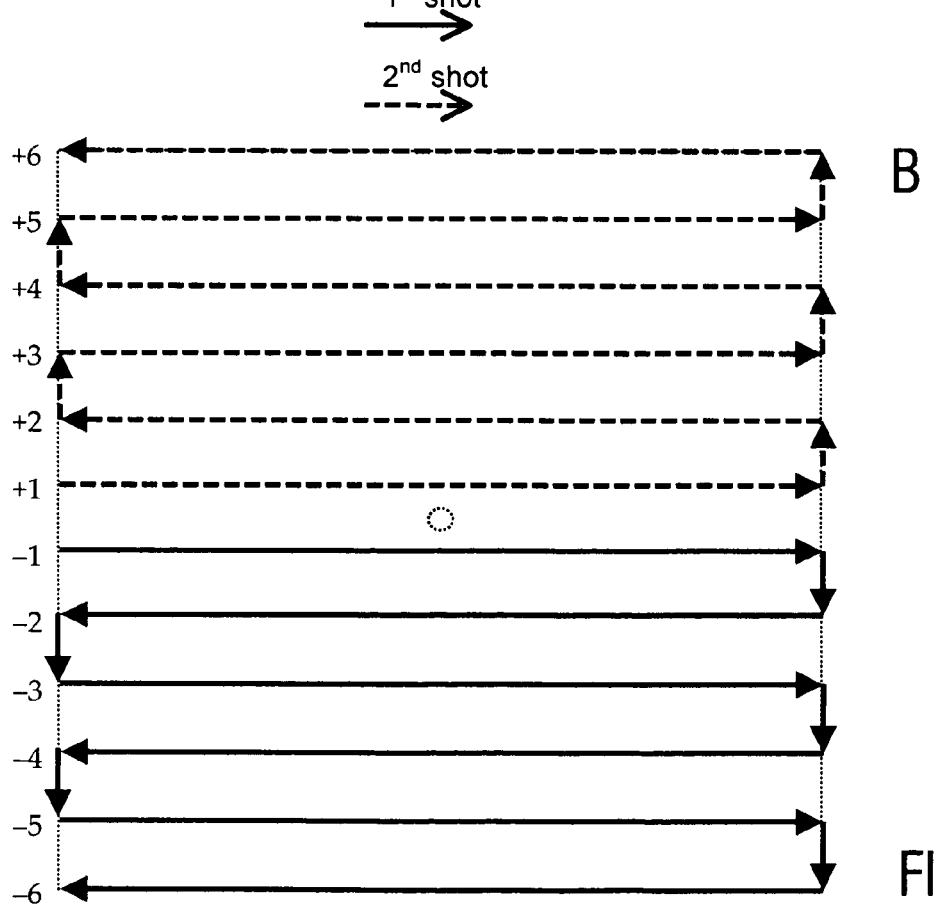
FIG. 3

1st shot

2nd shot $t = \tau_\omega$
$t = 0$

3rd shot $k_y$
$t$
$k_x$ $t = \tau_\omega$
$t = 0$

METHOD AND DEVICE FOR MAGNETIC RESONANCE SPECTROSCOPIC IMAGING

TECHNICAL FIELD

The present invention relates to a method of magnetic resonance spectroscopic (MRS) imaging of an object, in particular to an MRS imaging (MRSI) method with improved imaging contrast and/or shortened acquisition time. Furthermore, the invention relates to an MRSI device adapted for implementing the MRI method. Preferred applications of the invention are in the field of biomedical MRSI.

TECHNICAL BACKGROUND

In the present specification, reference is made to the following publications cited for illustrating prior art techniques, in particular conventional MRS imaging, and conventional implementations of certain procedural measures or partial aspects of excitation and encoding sequences.

[1] R. V. Mulkern, L. P. Panych. Echo planar spectroscopic imaging. Concepts Magn. Reson. 13: 213-237 (2001).
[2] T. R. Brown, B. M. Kincaid, K. Ugurbil. NMR chemical shift imaging in three dimensions. Proc. Natl. Acad. Sci. USA 79: 3523-3526 (1982).
[3] A. A. Maudsley, S. K. Hilal, W: H. Perman, H. E. Simon. Spatially resolved high resolution spectroscopy by "four-dimensional" NMR. J. Magn. Reson. 51: 147-152 (1983).
[4] P. Mansfield. Spatial mapping of the chemical shift in NMR. J. Phys. D: Appl. Phys. 16: L235-L238 (1983).
[5] P. Mansfield. Spatial mapping of the chemical shift in NMR. Magn. Reson. Med. 1: 370-386 (1984).
[6] D. N. Guilfoyle, A. Blamire, B. Chapman, R. J. Ordidge, P. Mansfield. PEEP—a rapid chemical-shift imaging method. Magn. Reson. Med. 10: 282-287 (1989).
[7] S. Matsui, K. Sekihara, T. Onodera, H. Shiono. NMR chemical shift imaging method. U.S. Pat. No. 4,689,568 (1985).
[8] S. Matsui, K. Sekihara, H. Kohno. High-speed spatially resolved high-resolution NMR spectroscopy. J. Am. Chem. Soc. 107: 2817-2818 (1985).
[9] S. Matsui, K. Sekihara, H. Kohno. Spatially resolved NMR spectroscopy using phase-modulated spin-echo trains. J. Magn. Reson. 67: 476-490 (1986).
[10] M. Doyle, P. Mansfield. Chemical-shift imaging: A hybrid approach. Magn. Reson. Med. 5: 255-261 (1987).
[11] R. Bowtell, M. G. Cawley, P. Mansfield, A. D. H. Clague. Proton chemical-shift mapping using PREP. J. Magn. Reson. 82: 634-639 (1989).
[12] K. Oshio, W. Kyriakos, R. V. Mulkern. Line scan echo planar spectroscopic imaging. Magn. Reson. Med. 44: 521-524 (2000).
[13] E. Adalsteinsson, P. Irarrazabal, D. M. Spielman, A. Macovski. Three-dimensional spectroscopic imaging with time-varying gradients. Magn. Reson. Med. 33: 461-466 (1995).
[14] P. Webb, D. Spielman, A. Macovski. A fast spectroscopic imaging method using a blipped phase encode gradient. Magn. Reson. Med. 12: 306-315 (1989).
[15] A. Ebel, N. Schuff. Accelerated 3D echo-planar spectroscopic imaging at 4 Tesla using modified blipped phase-encoding. Magn. Reson. Med. 58: 1061-1066 (2007).
[16] P. A. Bottomley. Selective volume method for performing localized NMR spectroscopy. U.S. Pat. No. 4,480,228 (1984).
[17] J. Frahm, K. D. Merboldt, W. Hanicke. Localized proton spectroscopy using stimulated echoes. J. Magn. Reson. 72: 502-508 (1987).
[18] S. Posse, D. Le Bihan. Method and system for multidimensional localization and for rapid magnetic resonance spectroscopic imaging. U.S. Pat. No. 5,709,208 (1998).
[19] S. Posse, C. DeCarli, D. Le Bihan. Three-dimensional echo-planar MR spectroscopic imaging at short echo times in the human brain. Radiology 192: 733-738 (1994).
[20] S. Posse, G. Tedeschi, R. Risinger, R. Ogg, D. Le Bihan. High speed $^1$H spectroscopic imaging in human brain by echo planar spatial-spectral encoding. Magn. Reson. Med. 33: 34-40 (1995).
[21] S. Matsui, K. Sekihara, H. Kohno. High-speed spatially resolved NMR spectroscopy using phase-modulated spin-echo trains. Expansion of the spectral bandwidth by combined used of delayed spin-echo trains. J. Magn. Reson. 64: 167-171 (1985).
[22] R. Otazo, B. Mueller, K. Ugurbil, L. Wald, S. Posse. Signal-to-noise ratio and spectral linewidth improvements between 1.5 and 7 Tesla in proton echo-planar spectroscopic imaging. Magn. Reson. Med. 56: 1200-1210 (1996).
[23] D. N. Guilfoyle, P. Mansfield. Chemical-shift imaging. Magn. Reson. Med. 2: 479-489 (1985).
[24] US 2009/0091322 A1.
[25] S. Posse, R. Otazo, S. Y. Tsai, A. E. Yoshimoto, F. H. Lin. Single-shot magnetic resonance spectroscopic imaging with partial parallel imaging. Magn. Reson. Med. 61: 541-547 (2009).
[26] K. P. Pruessmann, M. Weiger, M. B. Scheidegger, P. Boesiger. SENSE: Sensitivity encoding for fast MRI. Magn. Reson. Med. 42: 952-962 (1999).
[27] M. A. Griswold, P. M. Jakob, R. M. Heidemann, M. Nittka, V. Jellus, J. Wang, B. Kiefer, A. Haase. Generalized auto-calibrating partially parallel acquisitions (GRAPPA). Magn. Reson. Med. 47: 1202-1210 (2002).
[28] M. A. Brown. Time-domain combination of MR spectroscopy data acquired using phased-array coils. Magn. Reson. Med. 52: 1207-1213 (2004).
[29] S. Hetzer, T. Mildner, H. E. Möller. A modified EPI sequence for high-resolution imaging at ultra-short echo times. Proc. ISMRM 17: 2663 (2009).
[30] PCT/EP 2009/002345 (not published on the priority date of the present specification).
[31] A. Haase, J. Frahm, W. Haenicke, D. Matthei. $^1$H NMR chemical shift selective (CHESS) imaging. Phys. Med. Biol. 30: 341-344 (1985).
[32] J. P. Felmlee, R. L. Ehman. Spatial presaturation: A method for suppressing flow artifacts and improving depiction of vascular anatomy in MR imaging. Radiology 164: 559-564 (1987).
[33] R. R. Ernst, G. Bodenhausen, A. Wokaun. Principles of Nuclear Magnetic Resonance in One and Two Dimensions. Clarendon Press, Oxford (1987).
[34] F. Schmitt, P. A. Wielopolski. Echo-planar image reconstruction. In: F. Schmitt, M. K. Stehling, R. Turner, eds. Echo-Planar Imaging: Theory, Technique and Application. Springer, Berlin (1998); pp. 141-178.
[35] D. C. Noll, C. H. Meyer, J. M. Pauly, D. G. Nishimura, A. Macovski. A homogeneity correction method for magnetic resonance imaging with time-varying gradients. IEEE Trans. Med. Imaging 10: 629-637 (1991).
[36] L. C. Man, J. M. Pauly, A. Macovski. Multifrequency interpolation for fast off-resonance correction. Magn. Reson. Med. 37: 785-792 (1997).

[37] G. Bodenhausen, R. Freeman, D. L. Turner. Suppression of artifacts in two-dimensional J spectroscopy. J. Magn. Reson. 27: 511-514 (1977).
[38] J. Hennig. The application of phase rotation for localized in vivo proton spectroscopy with short echo times. J. Magn. Reson. 96: 40-59 (1992).
[39] S. W. Provencher. Estimation of metabolite concentrations from localized in vivo proton spectra. Magn. Reson. Med. 30: 672-679 (1993).
[40] M. A. Bernstein, K. F. King, X. J. Zhou. Handbook of MRI Pulse Sequences. Elsevier Academic Press, Amsterdam (2004).

Mapping of the nuclear magnetic resonance (NMR) chemical shift (i.e. spectroscopic information) is of great potential value, for example, for non-invasively studying metabolic heterogeneity of biological tissues in vivo or for investigating the three-dimensional (3D) composition of materials. In such applications, the spectroscopic information introduces a separate dimension besides the three spatial dimensions [1]. Consequently, additional scan time will be required in comparison to standard magnetic resonance imaging (MRI) methods relying on the assumption that only a single resonance from a high-concentration substance, such as the ubiquitous water in biological systems, is present. In conventional chemical shift imaging (CSI) [2, 3], pure phase encoding is used to acquire spectra from different volume elements (voxels) throughout the object. In particular, the spatial encoding step (i.e. application of a magnetic field gradient for spin-warp-type phase encoding) precedes the spectroscopic readout, during which no gradients are applied. This requires that the number of separately encoded measurements equals the number of voxels. For example, assuming a repetition time, $T_R$, of 1 s and a single average, the time needed to encode a two-dimensional (2D), 32×32 spatial matrix for CSI would be 17:04 min!

With echo-planar spectroscopic imaging (EPSI) introduced by Mansfield [4, 5], spatial encoding is employed—at least in one dimension—during acquisition of the spectroscopic dimension, which allows for a much faster acquisition. This is possible, because the acquisition of spectroscopic information in the time domain (i.e. the collection of a free induction decay or an echo signal) is a relatively slow process with a typical sampling interval (spectral dwell time, $\tau_\omega$) on the order of 1 ms.

For example, the major brain metabolites in an in vivo proton ($^1$H) spectrum have resonances, which fall between the resonances of fat at 0.9 ppm (terminal methyl groups) and water at 4.7 ppm. This corresponds to a minimal spectral bandwidth, $\Delta v$, of 244 Hz ($\tau_\omega$=4.1 ms) at a magnetic field strength, $B_0$, of 1.5 T or 468 Hz ($\tau_\omega$=2.1 ms) at approximately 3 T. As another example, the chemical-shift range of metabolites routinely observed in in vivo phosphorus ($^{31}$P) spectra is defined by the signals of phosphomonoesters at 6.6 ppm and of the β-phosphate group of adenosine triphosphate (ATP) at −16.3 ppm, which corresponds to $\Delta v$=589 Hz and 1138 Hz ($\tau_\omega$=1.7 and 0.9 ms) at 1.5 and approximately 3 T, respectively. Due to sensitivity constraints, a nominal voxel size on the order of 1 cm or more (instead of 1 mm or less as achieved in high-resolution MRI) is sufficient in typical spectroscopic-imaging applications. For integrating spatial encoding during the intervals defined by $\tau_\omega$, gradient slew-rate performance is of paramount importance in addition to excellent gradient-amplitude stability and waveform reproducibility.

Further background techniques, which could be relevant for magnetic resonance spectroscopic (MRS) imaging, are discussed in the following. For simplicity, the discussion is initially restricted to the mapping of one spectral and two spatial dimensions. In particular, a slice-selective excitation scheme to select a plane of thickness $\Delta z$ at position $z_0$ from the object under investigation is considered. As signal acquisition occurs in the time domain, data is collected in k-space (i.e. a reciprocal spatial-spectral space) with axes $k_x$, $k_y$, and $k_\omega$ (note that $k_\omega$=t, where t is time). A subsequent Fourier transform permits reconstruction of an image with spatial dimensions x and y and chemical shift dimension ω. The same principles as described below may then be used to expand the EPSI variants in order to achieve encoding of three spatial plus one spectral dimension.

With hybrid EPSI techniques, only one-dimensional (1D) spatial information is encoded along with the spectral dimension in a single pass ("shot") of the sequence. In particular, spatial-spectral encoding can be achieved by periodically inverting a trapezoidal read-out gradient of amplitude $G_x$ to traverse k-space along a zig-zag trajectory while collecting a series of $N_y$ gradient echoes [6]. Each gradient lobe encodes the same spatial information (i.e. evolution along the $k_x$-axis) whereas the signal evolution from gradient echo to gradient echo encodes the spectroscopic information (i.e. evolution along the t-axis). Ideally, the interval between adjacent gradient echoes, $\Delta t_x/2$ (i.e. one half of the modulation period), corresponds to the inverse of the spectral bandwidth in the reconstructed spectra (i.e. $\Delta v=1/\tau_\omega=2/\Delta t_x$).

For the remaining spatial dimension, a standard phase-encoding scheme preceding the echo-planar readout may be used [6-9], which has also been referred to as phase-encoded echo planar (PEEP). Alternatively, the direction of the read-out gradient may be rotated by an angle increment $\Delta \phi$ in the xy-plane in successive shots to obtain a projection-reconstruction echo-planar (PREP) hybrid technique [5, 10, 11]. As yet another alternative, the line-scan imaging approach may be combined with EPSI (also referred to as line scan echo planar spectroscopic imaging, LSEPSI) to avoid saturation problems when selecting a short $T_R$ [1, 12]. Besides periodically alternating trapezoidal gradients, other wave-forms including sinusoidal [9] and triangular modulations [13] have also been proposed for EPSI. An approach to halve the number of phase-encoding steps and thereby the overall scan time in PEEP variants involves adding small gradient blips (along the y-direction) in between even and odd read-out gradient lobes. The alternating blipped gradient may be applied during each reversal of the read-out gradient [14] or between pairs of even/odd read-out gradient lobes [15].

Apart from applying a simple excitation pulse of flip angle α or a spin-echo or stimulated-echo pulse sequence to excite spins in a slice (with subsequent 2D-spatial and spectral encoding) or in a 3D object (with subsequent 3D-spatial plus spectral encoding), it may be advantageous—especially in $^1$H spectroscopic imaging in vivo—to pre-localize a volume of interest (VOI) by combining a standard single-voxel technique, such as point-resolved spectroscopy (PRESS) [16] or stimulated-echo acquisition mode (STEAM) [17], and a spatial suppression sequence to selectively saturate the spin system outside the VOI (outer-volume suppression, OVS). In particular, such pre-localization and OVS schemes have been integrated along with water suppression (WS) in a modular fashion into an EPSI readout in the so-called proton echo-planar spectroscopic-imaging (PEPSI) technique [18].

Due to the periodic inversion of the read-out gradient scheme in all of the above EPSI variants, magnetic field inhomogeneities, imperfections in the gradient pulses, or eddy currents induced by gradient switching lead to periodic mismatches between odd- and even-numbered echoes and produce aliasing artifacts. An approach to eliminate aliasing is obtained by rearranging the echoes acquired with positive and negative gradient polarities to obtain two sets of echoes for separate reconstruction [5, 7, 9]. After correction for the sign inversion, both data sets are added to maintain the signal-to-noise ratio (SNR). A disadvantage of this strategy is a doubling of the dwell time (i.e. $\tau_\omega = \Delta t_x$) and, hence, a reduction of the spectral bandwidth by a factor of ½ (i.e. $\Delta v = 1/\Delta t_x$). This might lead to undersampling of high-frequency components and thus aliasing of resonances outside of the bandwidth into the observed spectral window, especially at high magnetic fields.

A method for retaining the spectral bandwidth is spatial-spectral oversampling, which also reduces chemical-shift artifacts but leads to a greater demand on the gradient performance [19, 20]. Other approaches to expand the spectral bandwidth include shifting of the gradient modulation sequence with respect to the excitation pulse by a variable delay, $t_D$, in subsequent shots [21] or increasing the amplitudes of the negative gradient lobes to concomitantly reduce their duration [7, 9]. A disadvantage of shifting the gradient modulation sequence is an increased scan time by a factor corresponding to the number of different delays. Shorter modulation periods achieved by asymmetric gradient modulation come at the expense of an SNR loss because only echoes refocused during the positive lobes can be used for image reconstruction. The bandwidth may also be preserved by appropriately splicing together the signals for subsequent experiments with cyclically inverted starting phases of the gradient waveforms, which requires two permutations (i.e. a two-shot experiment) in the case of 1D spatial encoding [5].

In principle, continuous data sampling during the entire gradient waveform is advantageous to minimize the acquisition bandwidth and thus improve the SNR [22]. This implies that even with trapezoidal gradients nonlinear sampling is used during some fraction (i.e. the ramp times) of the total acquisition window. This requires appropriate interpolation (regridding) of the data to correct for ramp-sampling distortions of the k-space trajectory. In addition, chemical-shift artifacts become a function of k-space encoding during ramp sampling, which may cause edges of chemically shifted species, such as peripheral lipid signals, to be more displaced than metabolite resonances.

Single-shot encoding of two spatial dimensions along with the spectral dimension is theoretically possible if two gradients, $G_x$ and $G_y$, are periodically inverted. With echo-planar shift mapping (EPSM), both gradients are modulated in a trapezoidal fashion but with different amplitudes and modulation periods (e.g. $G_y < G_x$ and $2\Delta t_y > 2\Delta t_x$) [5, 23]. It is noted the technique of splicing together signals from subsequent experiments with cyclically inverted starting phases of the gradient waveforms to correct for aliasing under preservation of the spectral bandwidth as described above requires four permutations (i.e. a four-shot experiment) in the case of 2D spatial encoding [5]. A major problem with using a relatively long flat-top time of a trapezoidal gradient (i.e. a constant gradient) for phase encoding is that the samples are not uniformly spaced on a rectilinear k-space grid, which requires regridding of the data prior to the Fourier transform.

More recently, a single-shot variant of the PEPSI technique has been proposed that utilizes parallel-imaging techniques for obtaining 2D spatial encoding during a single spectral dwell time [24, 25].

OBJECTIVE OF THE INVENTION it is an objective of the present invention to provide an improved MRS imaging method, which is capable of avoiding disadvantages of the conventional techniques. In particular, it is an objective of the invention to provide the MRS imaging method with improved imaging or spectroscopic contrast, improved SNR, shortened acquisition time and/or improved applications in biomedical imaging. Furthermore, the objective of the invention is to provide an improved magnetic resonance (MR) imaging device avoiding disadvantages of conventional MR imaging devices.

These objectives are solved with methods and devices as defined in the independent claims. Advantageous embodiments and applications of the invention are defined in the dependent claims.

SUMMARY OF THE INVENTION

According to a first aspect of the invention, a method of magnetic resonance spectroscopic imaging of an object is provided, wherein the object (O) includes at least one chemical species to be imaged, said chemical species exhibiting magnetic resonance signals of nuclei with a magnetogyric ratio $\gamma_A$ within a specific spectral bandwidth. The method comprises the following steps.

Firstly, the object is arranged in a stationary magnetic field and subjected to one or more first sampling sequences ("shots") each with an excitation sequence and an encoding sequence including phase-encoding and read-out gradients, and magnetic resonance signals (gradient-echo signals) created in the object in response to the at least one first sampling sequence are collected (sensed). The phase-encoding and read-out gradients of the at least one first sampling sequence are designed such that a sampling of the k-space with a plurality of first sampling trajectories through at least one k-space segment of the k-space is formed along a phase-encoding direction. Each of said first sampling trajectories begins in a central k-space region and continues to a k-space border of the respective k-space segment. Furthermore, each of said first sampling trajectories has a duration equal to or below a spectral dwell time corresponding to the reciprocal spectral bandwidth. With the at least one first sampling sequence, at least one first set of gradient-echo signals is obtained, which are sensed along said first sampling trajectories.

Secondly, for further covering the k-space, at least one second set of gradient-echo signals is collected, which are obtained along a plurality of second sampling trajectories, the number of said second sampling trajectories being equal to the number of said first sampling trajectories and the first and second sampling trajectories being mutually mirrored relative to a predetermined k-space line in the central k-space region. This k-space line is selected depending on the begin of the first sampling trajectory in the k-space. Typically, the first and second sampling trajectories are mutually mirrored relative to a central k-space line or, with $k_x$- and $k_y$-axes spanning the k-space and assuming the direction of frequency encoding (i.e. read-out direction) along the x-axis and the direction of phase encoding along the y-axis, relative to a parallel to the $k_x$-axis shifted by an amount of $\Delta k_y/2$, where $\Delta k_y$ denotes the separation of adjacent k-space lines along the $k_y$-direction.

Finally, a spectrally resolved image of the object is reconstructed based on the first and second sets of gradient-echo signals. The spectrally resolved image comprises a voxel matrix with a predetermined spatial resolution, wherein spectroscopic information is assigned to each of the voxels. The reconstructing step may comprise any known image reconstruction algorithm, like a Fourier transform of the collected gradient-echo signals and/or an adaptation (fitting) of the time dependency of the gradient-echo signals at each voxel to a predetermined model function.

According to a second aspect of the invention, an imaging device for MRI of an object is provided, which comprises a main magnetic device arranged for creating a stationary magnetic field, a gradient device arranged for generating sampling sequences, a transmitter device arranged for creating excitation pulses, a receiver device arranged for collecting the gradient-echo signals, a control device arranged for controlling the gradient device and the transmitter device, the control device being adapted for creating the at least one first sampling sequence, and an image reconstructing circuit arranged for reconstructing a spectroscopic image of the object based on the gradient-echo signals.

Advantageously, the inventive method offers a high-speed sampling of spectroscopic information in multiple spatial dimensions. With the first sampling sequence, gradient-echo signals are repeatedly collected with spatial resolution within each spectral dwell time. Depending on the spatial resolution to be obtained and the properties of the gradient device, the collection of gradient-echo signals does not cover the complete k-space, but is restricted to one or more k-space segments. Further gradient-echo signals required for completely covering the k-space are collected along the second sampling trajectories and optionally—if one single first sampling sequence would not be sufficient for covering the k-space— with further sampling sequences (see below). Thus, a time series of gradient-echo signals for each voxel is obtained allowing the reconstruction of spectroscopic information.

The inventive technique comprises a segmental center-out echo-planar spectroscopic imaging sequence (also called: SCEPSIS). With the inventive SCEPSIS method, the spatial-spectral k-space is sampled in $n_{seg}$ segments ($n_{seg}$=2, 4, 6, . . . ), which with most of the embodiments requires $n_{seg}$ shots. The $n_{seg}$ segments may comprise two half k-spaces ($n_{seg}$=2) or even smaller portions of the k-space. In particular, $N_y \times N_\omega / n_{seg}$ echoes are acquired per segment along a center-out trajectory to encode $N_y/n_{seg}$ lines in the $k_x k_y$-plane at times t=0, $\tau_\omega$, $2\tau_\omega$, . . . , $(N_\omega-1) \times \tau_\omega$.

As compared to conventional EPSI variants, a number of characteristic differences exist for the present invention:
(a) Phase encoding blips are introduced in such a manner that a line through or near the k-space center is sampled at the begin of a dwell time interval with a length according to the spectral dwell time ("onset of a spectral dwell time"). With the limited number of lines that can be acquired during the spectral dwell time (e.g. a maximum of eight with currently available whole-body gradient systems of human-scale MRI scanners), only one half of k-space (or less if higher segmentation is used) is sampled during one spectral dwell time in a way that ensures that lines at the edge of k-space are acquired towards the end of the dwell time interval ("end of the spectral dwell time"), i.e. along a center-out trajectory. The echo decay is concomitantly arranged in time with the trajectory from the center towards the edge of k-space. This feature mitigates phase-encoding artifacts resulting from the chemical shift of off-resonance signals. To return to the central k-space region, a "flyback gradient" is used in phase-encoding direction at the end of the dwell time interval. Alternatively, it may be advantageous to use an initial "prephasing gradient" and move the flyback gradient to the onset of a spectral dwell time.
(b) The effect of chemical shift on spatial encoding during the acquisition of one k-space line can be considered to be negligible as long as this duration is much shorter than the spectral dwell time (negligible compared with the spectral dwell time). With the inventive SCEPSIS method, this condition can be reached by increasing the number of acquired lines per spectral dwell time. As a result, sampling is performed with both positive and negative polarities of the read-out gradient lobes.
(c) Due to the use of center-out k-space trajectories, the echo time, $T_E$, can be minimized, which maximizes the SNR and permits detection of resonances with a short $T_2$ relaxation time as well as strongly coupled multiplets.
(d) Nulling of the zero-th moment of the periodic read-out and/or phase-encoding gradient waveforms is not required at each spectral dwell time but may also be performed during the subsequent spectral dwell time (in the case of odd values of $N_y/n_{seg}$). However, mitigation of eddy currents may benefit from periodic nulling at the end of each spectral dwell time, which requires an even value of $N_y/n_{seg}$.
(e) Current eddy-current compensation techniques involve a hardware correction during the gradient ramps with a sum of exponentials. This may lead to highly non-linear sampling without a priori knowledge of the exact trajectory if ramp-sampling techniques are employed. With the embodiments of the inventive SCEPSIS technique, ramp sampling is not required for obtaining a sufficient spectral bandwidth, and signal acquisition can be typically restricted to periods on the flat tops of the (trapezoidal) read-out gradient pulses. Ramp sampling is, however, not precluded and may be used if it is deemed advantageous.
(f) Previously suggested EPSI variants typically aim at achieving one of two opposite features: either a high spatial resolution is preferred leading to relatively long scan times, or a minimal acquisition time (i.e. a high temporal resolution) is preferred resulting in relatively low spatial resolution. The inherent segmentation capabilities of the SCEPSIS methods permit a high degree of flexibility in trading temporal for spatial resolution for optimal adjustment to the specific task. In particular, a temporal resolution similar to that achieved with single-shot PEPSI [25] may be obtained.

Preferred applications of the invention are present in biological and medical imaging, in particular for imaging metabolite substances in tissue. Preferably, the observed nucleus of imaged chemical species is one of $^1$H, $^2$H, $^3$He, $^6$Li, $^7$Li, $^{13}$C, $^{14}$N, $^{15}$N, $^{17}$O, $^{19}$F, $^{23}$Na, $^{29}$Si, $^{31}$P, $^{39}$K, $^{57}$Fe, $^{59}$Co, $^{129}$Xe, or $^{133}$Cs. However, the invention is also compatible with any other nucleus with a non-zero nuclear spin.

Advantageously, collecting the at least one second set of gradient-echo signals along the plurality of second sampling trajectories can be done with different techniques. Preferably, this is done by subjecting the object to at least one second sampling sequence ("second shot"). The phase-encoding gradients of the first and second sampling sequences have mutually reversed gradient polarities, so that at least one complementary k-space segment, which was not covered by the first sampling sequence, is sampled. This embodiment may have advantages in terms of the improved SNR and correction capabilities obtained with the sensing of the second set of gradient-echo signals.

Alternatively, as the k-space has Hermitian symmetry, the gradient-echo signals along the second sampling trajectories can be computed from the plurality of first k-space samplings using the Hermitian symmetry (half Fourier embodiment). This embodiment may have advantages in terms of a fast signal acquisition.

Although reference is made in the following description to the embodiment using the mirrored first and second sampling sequences, the invention can be implemented in all cases with the half Fourier embodiment in an analogue manner.

According to a preferred embodiment of the invention, the first sampling sequence is selected such that the first sampling trajectories subsequently cover at least two different k-space segments in opposite halves of the k-space with cyclic permutations. Furthermore the second sampling trajectories subsequently cover the at least two different k-space segments with reversed polarities. This embodiment may have advantages in terms of avoiding eddy currents and adapting the gradient switching frequencies such that mechanical resonances within the scanner device are avoided. As a preferred example, with $n_{seg}=2$, the first sampling trajectories subsequently cover two different k-space segments in opposite halves of the k-space in an alternating manner, and the $N_\omega$ second sampling trajectories subsequently cover the two different k-space segments in an alternating manner with reversed polarities.

The alternating coverage of the k-space segments after each of the excitation shots is not strictly necessary. According to an alternative embodiment of the invention, the first sampling sequence is selected such that the first sampling trajectories subsequently cover a first one of two different k-space segments, while the second sampling trajectories subsequently cover a second one of the two different k-space segments with reversed polarity. Thus, the complete k-space is covered while compared with the above embodiment (alternating coverage of the k-space segments) the frequency of switching the encoding gradients is changed. Again, unintended mechanical resonances within the imaging device (scanner) can be avoided.

If one single first sampling sequence would not be sufficient for covering the k-space, further sampling sequences can be provided. Accordingly, the object is subjected to a plurality of first sampling sequences resulting in a sampling of a plurality of k-space segments of the k-space. The first sampling sequences are designed such that the k-space segments subsequently sampled are arranged in an interleaved (overlapping) fashion. To this end, the flyback gradient pulse is used for rewinding the k-space trajectories after reaching the k-space border and before starting the next k-space trajectory of the subsequent spectral dwell time from the intended position in k-space. For covering the complete k-space, the object is further subjected to a plurality of second sampling sequences providing the mirrored second sampling trajectories as described above. This embodiment may provide advantages if, depending on the application, the number of lines that can be acquired during the spectral dwell time can be e.g. three or two only. This is possible e.g. if the spectral bandwidth is relative large so that the spectral dwell time is too short for accommodating more than two or three sampling lines (as it may be the case with sensing of e.g. $^{31}$P resonances in biological tissues at a magnetic field strength of 3 T or higher). Furthermore, the interleaved arrangement may have advantages for increasing the spatial imaging resolution (increasing the image matrix).

As a further advantage, multiple variants of the center-out-sampling technique are available, which differ with regard to the selection of the starting trajectory of the first sampling sequence. The starting trajectory may be on the central k-space line (line exactly through the k-space center). In particular, all the first sampling trajectories begin at the central k-space line, and the second sampling trajectories are mirror images of the first sampling trajectories with the reflection axis being the $k_x$-axis. This embodiment allows an averaging of the gradient-echo signals collected along the common central k-space line yielding common central k-space line signals, wherein the image of the object is reconstructed from the data in the k-space segments utilizing the common central k-space line signals.

Furthermore, the first sampling trajectories begin at a central k-space line, and the second sampling trajectories are mirror images of the first sampling trajectories with the reflection axis being a parallel to the $k_x$-axis shifted by an amount of $\Delta k_y/2$ (or $-\Delta k_y/2$), where $\Delta k_y$ denotes the separation of adjacent k-space lines along the $k_y$-direction. Furthermore, the first sampling trajectories begin with a distance of $-\Delta k_y/2$ (or $+\Delta k_y/2$) from the $k_x$-axis, and the second sampling trajectories are mirror images of the first sampling trajectories with the reflection axis being the $k_x$-axis. As an advantage for an image reconstruction if a rather small matrix with coarse spatial resolution is sampled, these variants provide an increased acquisition data matrix.

With the inventive method, parallel imaging, in particular sensitivity encoding (SENSE, see [26]) is not required. However, the method is fully compatible with parallel imaging in both image space, such as SENSE, or in k-space, such as the generalized autocalibrating partially parallel acquisitions (GRAPPA) technique [27]. Consequently, it does not rely on the use of phased-array radiofrequency (RF) coils. However, employing a multi-channel phased-array coil may be beneficial for improving the SNR. In such cases, data acquired with different coil elements may be combined in the time domain, for example, according to a method proposed by Brown [28]. In particular, with a further embodiment of the invention, the first and second sampling sequences are selected such that the trajectories spare predetermined reference lines in the k-space, and reference echo signals along the reference lines are additionally computed based on the information from the multiple elements of the phased-array coil.

According to another embodiment of the invention, a 3D encoding of the object is provided. According to a first variant, the gradient-echo signals are collected, and the spectrally resolved image of the object is reconstructed with a plurality of planar slices through the object. According to a second variant, the gradient-echo signals are collected, and the spectrally resolved image of the object is reconstructed while preceding the first and the second sampling sequences with a phase-encoding step in a third direction. According to a third variant, the steps of k-space sampling can be repeated with changing a direction of the phase-encoding gradients by a rotation-angle increment ($\Delta\phi$).

If according to further embodiment of the invention, the excitation sequence can be combined with at least one of an outer-volume suppression module, a water-suppression and a solvent-suppression module, advantages for sensing the eventually weak signals from dissolved compounds can be obtained.

Advantageously, the SNR of the spectroscopic imaging can be further improved, if the object is subjected to at least one radiofrequency preparation pulse, and each or all of the excitation and encoding sequences are conducted after a predetermined magnetization-recovery delay time ($T_{delay}$) relative to the at least one preparation pulse.

The at least one preparation pulse may comprise a single 180° inversion pulse, a composite inversion pulse, an adiabatic inversion pulse, a sequence of RF inversion pulses designed to achieve inversion of the magnetization, or a sequence of RF pulses designed to achieve rotating the magnetization by 90° and to achieve saturation. The at least one preparation pulse can be adapted to influence the magnetization in only a predetermined region of the object.

To correct for aliasing effects due to the periodic inversion of the read-out gradient scheme, a phase correction of the sign-inverted echoes can be performed in k-space. As an example, one of the first and second sets of gradient-echo signals can be subjected to a phase correction using an inter-segment phase correction. For inter-segment phase correction, it may also be advantageous to measure the center of k-space twice at each spectral dwell time as proposed for the double-shot echo-planar imaging with center-out trajectories and intrinsic navigation (DEPICTING) imaging method [29, 30].

Alternatively, if the object includes at least one reference chemical species with a singlet magnetic resonance signal of nuclei with a magnetogyric ratio $\gamma_B$, one of the first and second sets of gradient-echo signals is subjected to a phase correction using a separate reference scan with an excitation frequency adjusted to a resonance position of the reference chemical species. The nuclei in the chemical species to be imaged and the nuclei in the reference chemical species can be identical. Otherwise, the magnetogyric ratio $\gamma_A$ of nuclei in the chemical species to be imaged and the magnetogyric ratio $\gamma_B$ of nuclei in the reference chemical species with a singlet magnetic resonance signal is different, and the phase correction is adjusted by taking into account the ratio $\gamma_A/\gamma_B$ of the respective magnetogyric ratios.

In spectroscopic imaging of biological tissues, a separate template scan is acquired for the phase correction (typically within less than a minute) with the excitation frequency adjusted to the $^1H$ resonance position of the water signal (or solvent signal). It is to be noted here, that the singlet signal from any reference chemical that is present at a sufficiently high concentration in the object under investigation or that may be hyperpolarized by an appropriate technique (e.g. optical-pumping methods or dynamic nuclear polarization) for improving the SNR may alternatively be used for the acquisition of the template scan. Thus, the magnetic resonance signal employed for the template scan does not have to lie in the spectral bandwidth selected for the spectroscopic imaging experiment as long as the frequency difference between the center frequency of the selected spectral bandwidth and the resonance position of the signal used for the template scan is known and properly accounted for in the correaction algorithm. In particular, the spectroscopic-imaging scan and the template scan may be performed with the resonance adjusted to nuclei of different magnetogyric ratios, $\gamma_A$ and $\gamma_B$, in the chemical species to be imaged and in the chemical compound used as reference for the template scan, respectively (e.g. $^{31}P$ and $^1H$).

According to another advantageous embodiment of the invention, an additional prephasing gradient can be applied for correcting unwanted echo shifts along the direction of phase encoding, which may be due to, for example, a variation of the magnetic susceptibility across the object or unsuppressed eddy currents.

BRIEF DESCRIPTION OF THE DRAWINGS

Further details and advantages of the invention are described in the following with reference to the attached drawings, which show in:

FIG. 3: k-space trajectories of further two-shot embodiments of an inventive SCEPSIS pulse sequence, in which the central k-space line is sampled only once, and the k-space trajectories of the first and second shot start (A) with offsets of, respectively, 0 and $+\Delta k_y$, or (B) with offsets of, respectively, $-\Delta k_y/2$ and $+\Delta k_y/2$ from the origin of the $k_y$-direction;

EMBODIMENTS OF THE INVENTION

Preferred embodiments of the invention are described in the following with particular reference to the construction of the excitation and encoding sequences. Timing sequences are graphically represented as introduced in standard publications. Details of creating the RF pulses and gradients of these sequences, collecting the MR signals and controlling an MR scanner as well as details of the construction of an MR scanner are not described as far as they are known from PCT/EP 2009/002345 (introduced to the present specification by reference) or from conventional MR imaging techniques. Furthermore, after reconstructing the at least one spectroscopic image of the object, the image can be subjected to a further image processing or image recording, displaying, storing, or printing as it is known in prior art.

SCEPSIS Method

Figure 1A:
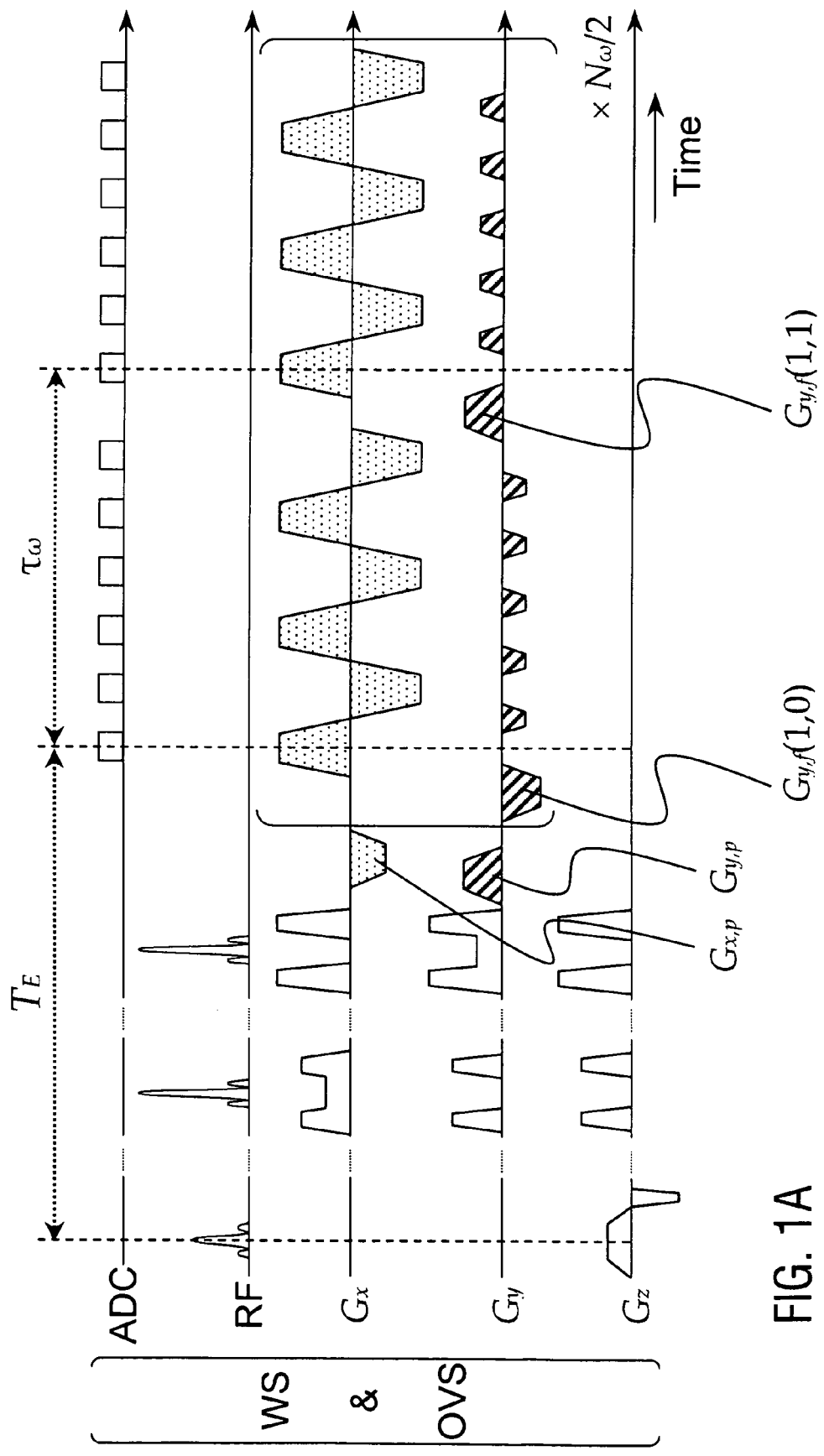
FIG. 1: (A) a first embodiment of an inventive SCEPSIS pulse sequence, corresponding individual k-space trajectories of (B) the first and (C) the second shot, and (D) overlay of all k-space trajectories acquired for each spectral dwell time.
Figure 1C:
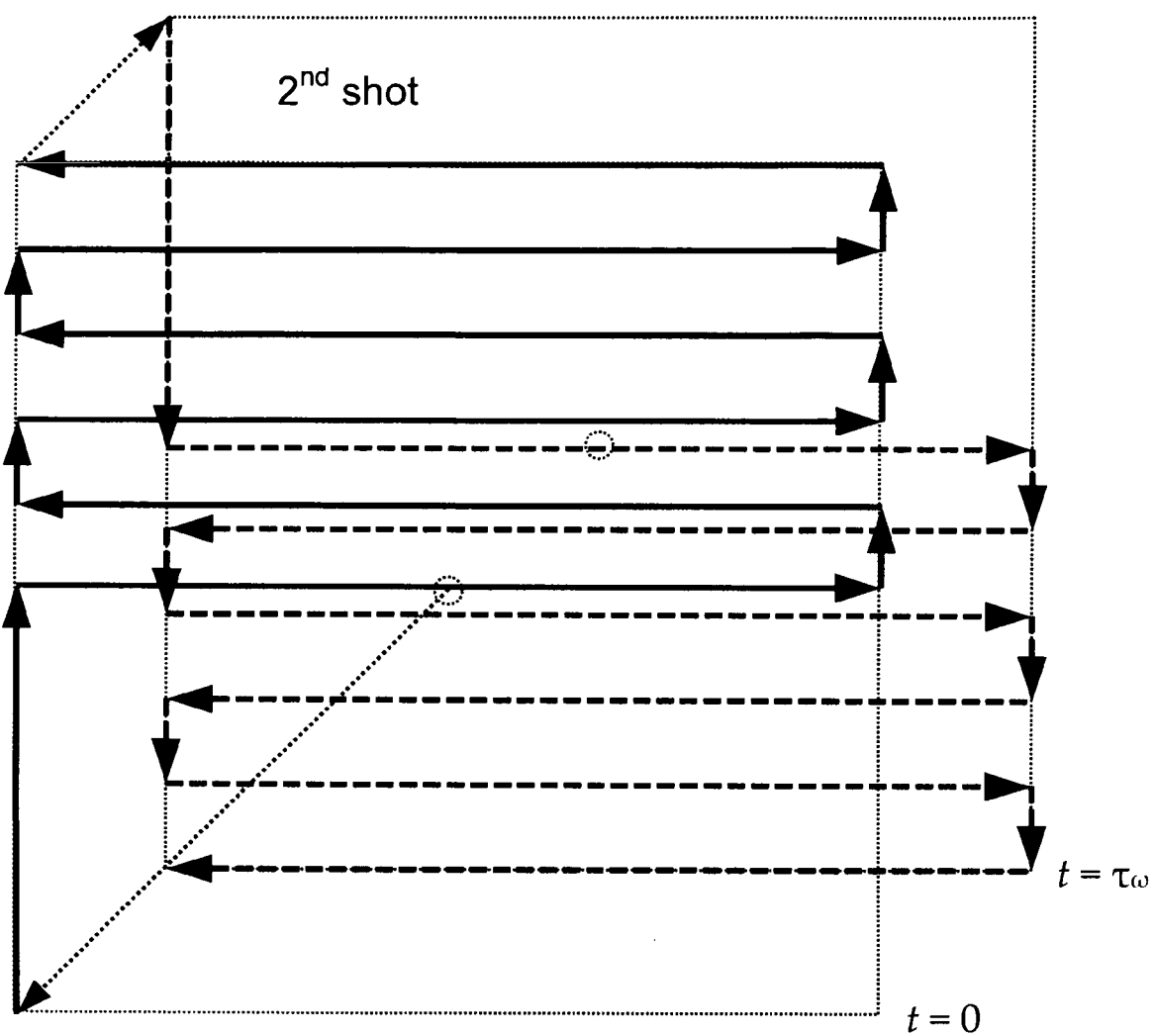
Figure 1D:
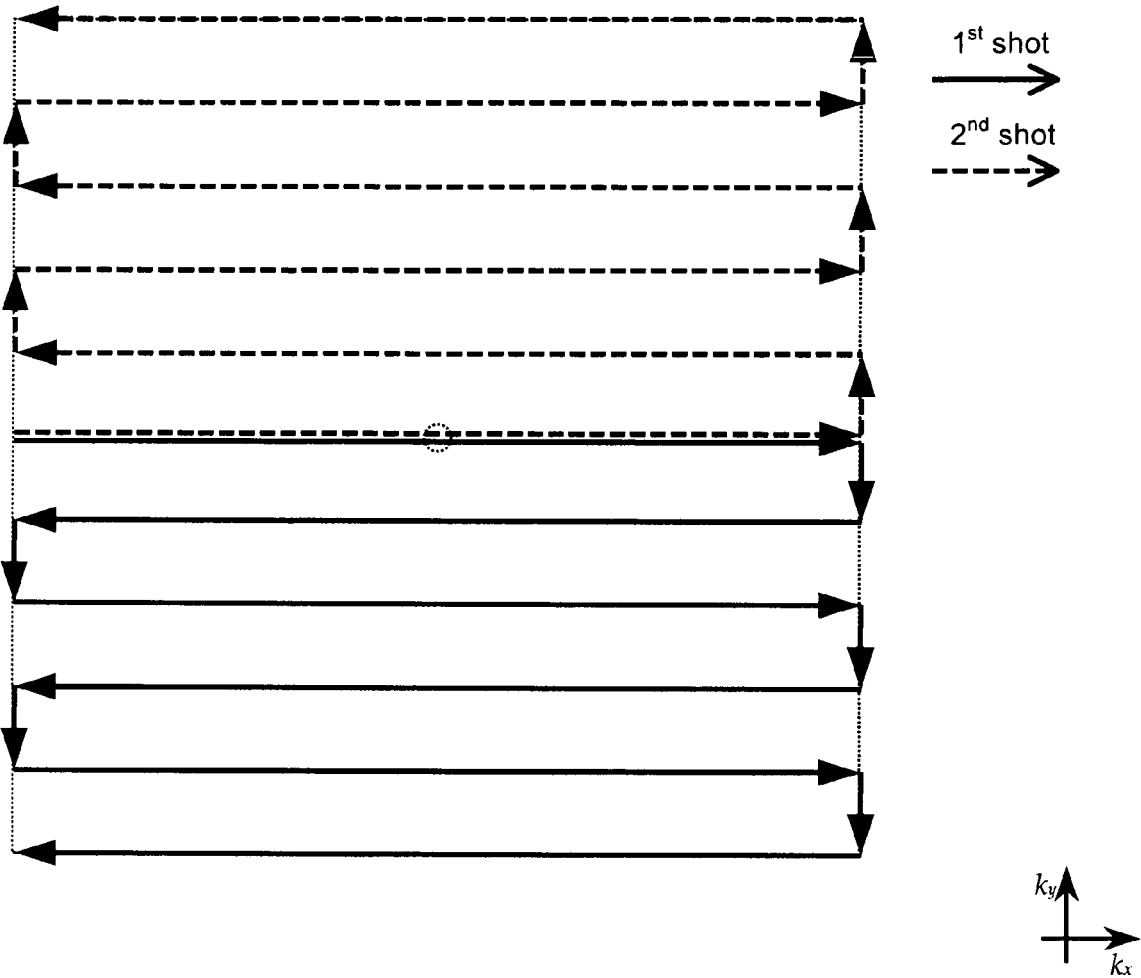

FIG. 1 shows a basic RF and gradient pulse sequence diagram of the first sampling sequence (FIG. 1A) and the corresponding first sampling trajectories in k-space (FIGS. 1B-1D) for the inventive SCEPSIS method employing a double-shot acquisition scheme (i.e. $_{seg}=2$). The first shot is obtained with the first sampling sequence, while the second shot is obtained with the second (mirrored) sampling sequence (not shown). In this example, a twice-refocused spin echo is generated in a pre-defined rectangular VOI, wherein the first excitation sequence is a PRESS module, which consists of three selective RF pulses (flip angles of 90°, 180°, and 180° along with slice-selection and spoiler gradients. It should be noted that different flip angles or other well-established combinations of RF pulses (e.g. a combination of two or more RF pulses to generate a spin echo or a combination of three or more RF pulses to generate a stimulated echo) or even a single RF pulse of flip angle α may also be used as an excitation module. Furthermore, excitation of the spin system may be performed in only a portion of the object under investigation (e.g. the human brain) or in the whole object.

In cases, as for example $^1$H spectroscopic imaging of biological tissues (or of other objects with a strong solvent peak), it may be advantageous to provide a preparation step, wherein e.g. a WS module (or solvent-suppression module) is executed prior to the excitation module to avoid dynamic-range problems due to the presence of a strong water signal (or solvent signal) besides weak signals from dissolved compounds (e.g. cerebral metabolites in the case of investigations of the brain). Such WS modules may be implemented, for example, by integrating appropriate chemical-shift selective (CHESS) RF pulses [31] followed by a dephasing gradient. Furthermore, contamination of the recorded spectra by unwanted resonances originating from chemicals present at high concentration out-side the VOI (e.g. extracranial lipids) may occur due to an unfavorable point-spread function. Furthermore, to mitigate such contamination, it may be advantageous or necessary to execute a suitable OVS module prior to the excitation module. Such OVS modules may be implemented, for example, by integrating appropriate spatial saturation RF pulses followed by dephasing gradients [32].

In FIG. 1A, the optional execution of potential WS and OVS modules is indicated by the parentheses preceding the excitation module. Depending on the type of excitation module, such WS and OVS modules may also be placed during the excitation module (e.g. in case of an excitation module generating a stimulated echo). To optimize the spectral bandwidth, it is advantageous to adjust the frequency of the WS module to the water resonance (or solvent resonance) and the frequency of the excitation module to the central frequency of the spectral range to be imaged.

Following the excitation module, a periodically inverted, trapezoidal read-out gradient waveform (indicated by the dotted gradient lobes in FIG. 1A) produces a series of gradient echoes. During reversal of the read-out gradient, short gradient blips along a direction that is perpendicular to the direction of the read-out gradient are applied for phase encoding (indicated by the hatched gradient lobes in FIG. 1A). In the current case, it is assumed that the direction of frequency encoding (i.e. read-out direction) is along the x-axis and the direction of phase encoding is along the y-axis. However, other directions for frequency and phase encoding are also possible.

The signal is acquired by a fast-sampling analog-to-digital converter (ADC), e.g. using a MAGNETOM TIM Trio (Siemens Medical Solutions, Erlangen, Germany) MRI scanner or any other suitable MRI scanner, during periods on the flat tops of the read-out gradient (indicated by rectangular boxes in FIG. 1A). By use of appropriate prephasing gradient lobes $G_{x,p}$ and $G_{y,p}$ prior to data collection along read-out and phase-encoding direction, it is achieved that the k-space data are sampled along a first sampling trajectory that begins with a k-space line through the center of the $k_xk_y$-plane at time t=0 as indicated by the solid line in FIG. 1B. The center of the $k_xk_y$-plane at each spectral dwell time is marked by a dotted circle (in FIG. 1B and in all other figures).

In particular, a flyback gradient $G_{y,f}(i_{seg}=1, i_\omega=0)$ is applied prior to data acquisition for correct positioning of the first k-space line. During an initial period of duration $\tau_\omega$ (here, $\tau_\omega=1.68$ ms), a total of $N_y/n_{seg}$ gradient echoes (here, $N_y/n_{seg}=6$) is collected and used for spatial encoding at time t=0. After acquisition of the $N_y/n_{seg}$ gradient echoes, the polarity of the phase-encoding gradient sequence is inverted to sample another set of $N_y/n_{seg}$ gradient echoes, which is used for spatial encoding at time t=$\tau_\omega$.

Sampling of the second train of first gradient echoes is performed along a trajectory that again begins with a k-space line trough the center of the $k_xk_y$-plane at time t=$\tau_\omega$ as indicated by the broken line in FIG. 1B. Again, an appropriate flyback gradient $G_{y,f}(i_{seg}=1, i_\omega=1)$ is applied for correct positioning of the first k-space line of the second dwell time. FIG. 1B further demonstrates that the bottom half of the $k_xk_y$-plane is sampled at time t=0 and the top half of the $k_xk_y$-plane is sampled at time t=$\tau_\omega$.

Overall, the gradient sequence enclosed in parentheses in FIG. 1A is repeated $N_\omega/2$ times following the single first excitation sequence to acquire $N_y \times N_\omega/n_{seg}$ gradient echoes for repeatedly encoding one half (alternating between bottom and top tiles) of each $k_xk_y$-plane at times t=0, $\tau_\omega$, $2\tau_\omega$, ..., $(N_\omega-1)\tau_\omega$.

Subsequently, for conducting the second sampling sequence including a second excitation sequence followed by a second encoding sequence of phase-encoding and read-out gradients, the whole RF and gradient pulse sequence is repeated at time $T_R$ (i.e. $T_R$ is equivalent to the duration between the onsets of the excitation modules of the first and second repetition or "shot") with inverted polarities of all hatched gradient lobes (FIG. 1A) and otherwise identical settings. This second shot produces another train of $N_y \times N_\omega/n_{seg}$ gradient echoes. Due to the reversed gradient polarities, k-space trajectories acquired at times $i_\omega \times \tau_\omega$ and $i_\omega \times \tau_\omega + T_R$ ($i_\omega$=0, 1, ..., $N_\omega-1$) are mirror images of each other (FIGS. 1B and 1C); that is, both start with a central k-space line but progress in opposite directions along the $k_y$-axis (FIG. 1D). The second set of gradient echoes acquired with the second shot is thus used for encoding the missing half of each $k_xk_y$-plane at times t=0, $\tau_\omega$, $2\tau_\omega$, ..., $(N_\omega-1)\tau_\omega$ (i.e. alternating between top and bottom tiles).

Both shots (first and second sampling sequences) produce equal quantities of transverse magnetization as long as complete longitudinal relaxation is achieved during $T_R$. If this condition is not achieved, selection of the Ernst angle [33] instead of 90° for the first pulse of the PRESS module is advantageous. If the SNR is insufficient for reliably detecting weak resonance lines (e.g. of metabolites in biological tissues with typical concentrations below 10 mmol/L), more pairs of acquisitions may be acquired in an identical fashion for signal averaging.

To suppress spurious signals generated by imperfections in the RF and gradient pulse sequence or scanner hardware, it is advantageous to apply appropriate phase cycling, that is, to cyclically alter the transmitter phase of one or more of the RF pulses of the excitation module in subsequent shots [33].

After a Fourier transform along the $k_x$-axis, the $N_\omega$ k-space data acquired at times t=0, $\tau_\omega$, $2\tau_\omega$, ..., $(N_\omega-1)\tau_\omega$ are separately corrected for inconsistencies in phase and intensity between adjacent k-space lines and between the two tiles of k-space data acquired for each spectral dwell time with separate shots. A technique for reducing Nyquist ghosting artifacts may be based, for example, on a separate reference scan (template scan) without phase blips and pair-by-pair correction of phase differences between odd and even echoes in each tile [34]. At short echo times, eddy currents induced by the slice-selection or the prephasing gradients might trigger echo shifts within the first k-space lines. This effect is easily corrected by a line-by-line phase correction for the first few effected echoes. For the remaining echoes, even echoes are manipulated only.

The two tiles of k-space data for each time point overlap along a line through the center of the $k_xk_y$-plane, which is recorded twice (i.e. once with each shot), as in the DEPICTING imaging method proposed recently [29, 30]. These two central k-space lines may thus be used as internal navigators for phase and intensity correction. The two corrected lines are then averaged for SNR improvement to generate a new central line for the final full k-space data. Because both tiles are acquired with opposite polarities of the phase blips, inhomogeneities of the main magnetic field induced by magnetic susceptibility variations produce simultaneous shifts in opposite directions along the phase-encoding direction. Correction of this artifact can be performed, if necessary, by removing off-resonance frequencies in k-space if the distribution of the magnetic field is precisely known across the object [35, 36]. For this purpose, a separate acquisition of a multi-echo field-map scan may be performed.

Finally, a spectrally resolved image of the object is reconstructed based on the collected gradient-echo signals. To this end, following the phase- and intensity corrections, the whole data is Fourier transformed along the $k_y$ axis to obtain a 2D matrix of time-domain spectral data that may be quantified in the time domain with a suitable algorithm (see e.g. [39]) simulating the effect of chemical shift on spatial encoding for each voxel or Fourier transformed to obtain 2D matrix of spectra, which may as well be further processed for extracting quantitative information.

Figure 2:
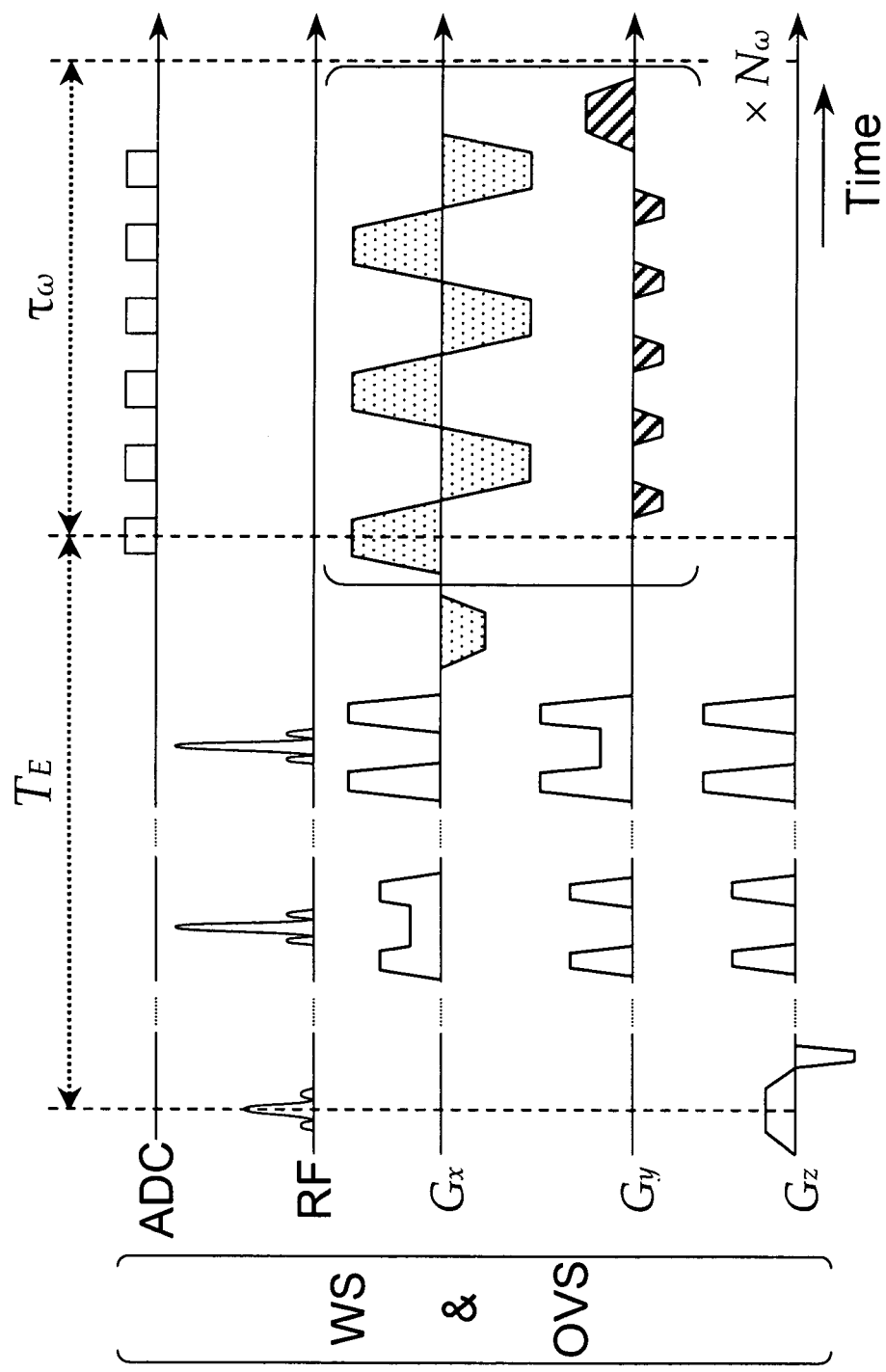
FIG. 2: a further embodiment of an inventive SCEPSIS pulse sequence without alternating acquisition of bottom and top parts of the $k_x k_y$-plane at successive spectral dwell times.

With the sequence implementation shown in FIG. 1, the portion of k-space acquired with each shot alternates between the bottom and top parts of the $k_xk_y$-plane between adjacent time points (see FIGS. 1B and 1C). It is, however, also possible to omit this alternation and sample the same portion of k-space at each time point (i.e. always the bottom part of the $k_xk_y$-plane at each spectral dwell time or always the top part). Such a modification is shown in FIG. 2. Comparing FIGS. 1A and 2 demonstrates that the overall period of the gradient waveform (as indicated by the parentheses) differs by a factor of two, which leads to a different frequency spectrum of the acoustic noise generated by rapid gradient switching.

Thus, choice of one of these two otherwise identical embodiments of the inventive SCEPSIS sequence can be used to avoid potentially harmful frequency bands in the acoustic spectrum (i.e. for avoiding mechanical resonances of the magnet or for reducing helium boil-off if a superconducting magnet is employed).

In yet another embodiment of the otherwise same sequences shown in FIGS. 1A and 2, it is also possible to shift the stack of lines acquired per spectral dwell time by an amount along the $k_y$-direction if the bottom part of the $k_xk_y$-plane is sampled ($\Delta k_y$ denotes the separation of adjacent k-space lines along the $k_y$-direction). This is achieved by proper adjustment of the prephasing gradient in phase-encoding direction and the flyback gradients. Thus, instead of sampling the central k-space line twice, the number of k-space lines at different values of $k_y$ is now increased by one (FIG. 3A). This procedure yielding, for example, an acquisition matrix 12×12 instead of 12×11 for the sequence implementations shown in FIGS. 1A and 2, may be advantageous if a rather small matrix with coarse spatial resolution is sampled. The benefits resulting from measuring twice the center line for intersegment phase and intensity differences are lost, a compromise that may be justified by the needs of a full k-space sampling of small matrices, such as 8×8 or 12×12. As an alternative, it may also be possible to shift the central k-space lines by amounts of $\pm\Delta k_y/2$ as indicated in FIG. 3B.

FIG. 4 shows an example of the acquisition of a 2D matrix of $^1H$ spectra from a slice through the brain of a normal human volunteer at a magnetic field strength of approx. 3 T using an implementation of the inventive SCEPSIS method shown in FIG. 1A. In particular, $T_E$=33 ms and $T_R$=1.7 s were used in this experiment. During each spectral dwell time, six gradient echoes (i.e. $N_y/n_{seg}$=6) were collected in sampling intervals of 120 μs to acquire a 12×11 matrix (reconstructed to 12×12; field of view, FOV, 204×204 mm², i.e. isotropic nominal voxel size of 17 mm or 4.91 mL) employing a double-shot SCEPSIS sequence. The dimensions of the VOI preselected by the PRESS module were 101×101×17 mm³. Four OVS slabs were positioned at the borders of the VOI. With a spectral dwell time of 1.68 ms, the spectral bandwidth was 595 Hz or 4.83 ppm. The maximal slew rates employed for the trapezoidal gradient waveforms were 164.5 T/m/s along readout direction and 43.3 T/m/s along phase-encoding direction. The number of time-domain sampling points was $N_\omega$=512. A total of 160 double-shots were acquired using a 16-step EXOR phase cycle [37, 38] and progressively stored to study the effect of the total acquisition time. The spectral data were processed with LCModel [39] for quantitative analysis.

More sequence parameters are given in the first column of Table 1. For comparison, Table 1 also shows parameters for an implementation at 7 T in the second column. Additionally, parameters for achieving larger image matrices by using a higher degree of segmentation are also shown in columns three to five.

TABLE 1

Examples of sequence parameters for the implementation of different inventive SCEPSIS methods for spectroscopic $^1H$ and $^{31}P$ imaging

| | Nucleus | | | | | |
|---|---|---|---|---|---|---|
| | $^1H$ | $^1H$ | $^1H$ | $^1H$ | $^1H$ | $^{31}P$ |
| $B_0$/T | 3 | 7 | 3 | 3 | 3 | 3 |
| Spectral bandwidth/ppm | 4.83 | 4.21 | 5.34 | 5.04 | 4.48 | 27.85 |
| $n_{seg}$ | 2 | 4 | 4 | 6 | 16 | 4 |
| $N_y/n_{seg}$ | 6 | 3 | 4 | 4 | 3 | 2 |
| Image matrix, $N_x \times N_y$ | 12 × 12 | 12 × 12 | 16 × 16 | 24 × 24 | 48 × 48 | 8 × 8 |
| FOV/mm | 204 | 200 | 160 | 192 | 192 | 180 |
| $G_x$ slew rate (T/m/s) | 164.5 | 167.8 | 163.1 | 152.9 | 163.1 | 161.2 |
| $G_y$ slew rate (T/m/s) | 43.3 | 149.1 | 83.9 | 119.0 | 98.9 | 96.7 |
| ADC sampling interval/μs | 120 | 120 | 240 | 240 | 360 | 160 |
| $\tau_\omega$/ms | 1.68 | 0.80 | 1.52 | 1.61 | 1.81 | 0.72 |

Figure 4A:
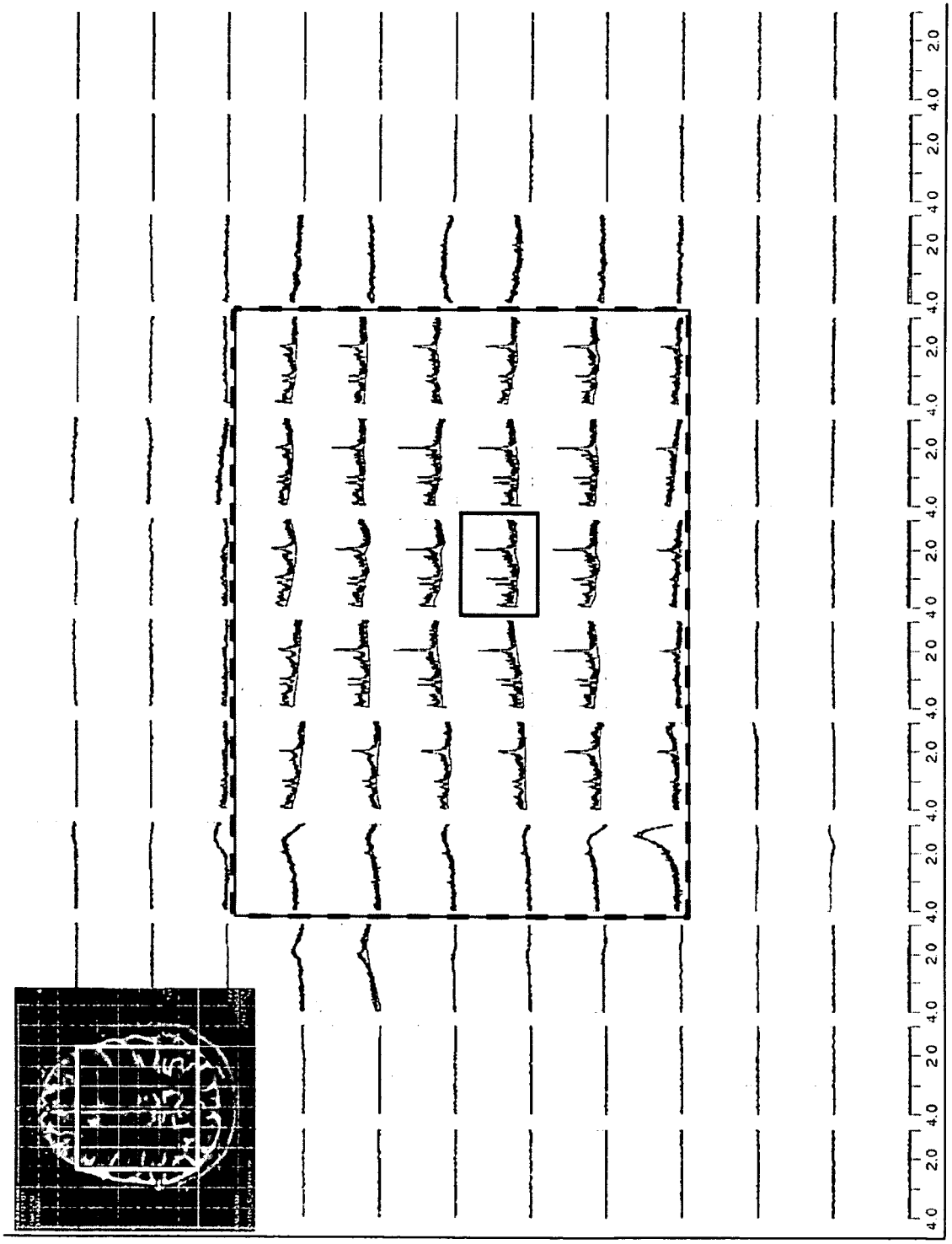
FIG. 4: a graphical representation of experimental results obtained with an inventive SCEPSIS pulse sequence showing (A) a mosaic display of all spectra obtained in a 2D slice through the brain of a human subject at the position indicated in the upper left insert and a spectrum from a central region of the slice obtained after (B) 1:01 min and (C) 5:33 min of signal averaging.
Figure 4B:
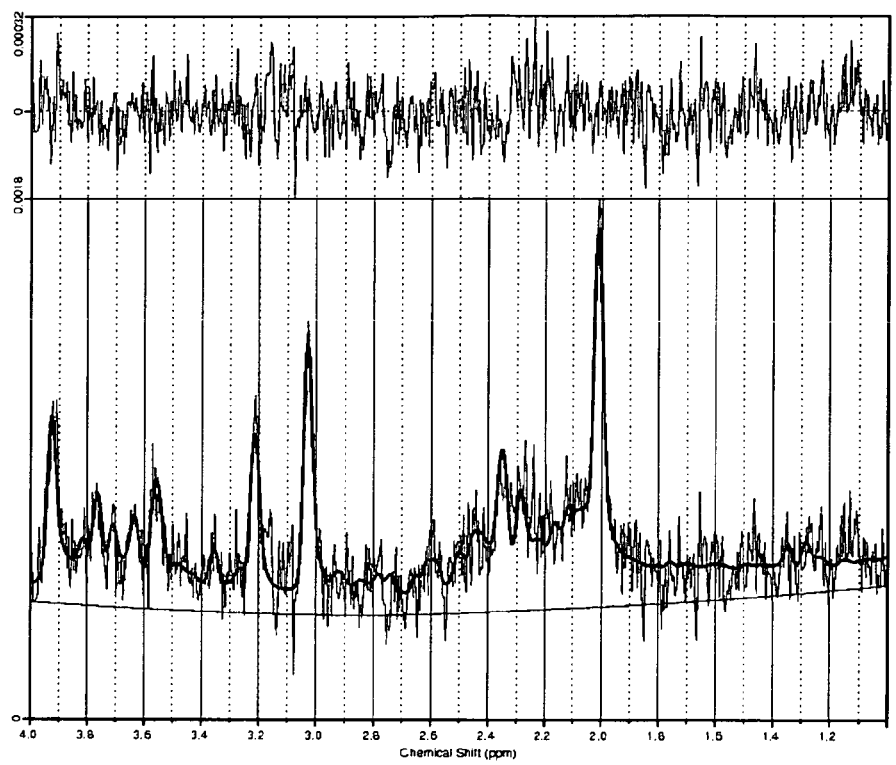
Figure 4C:
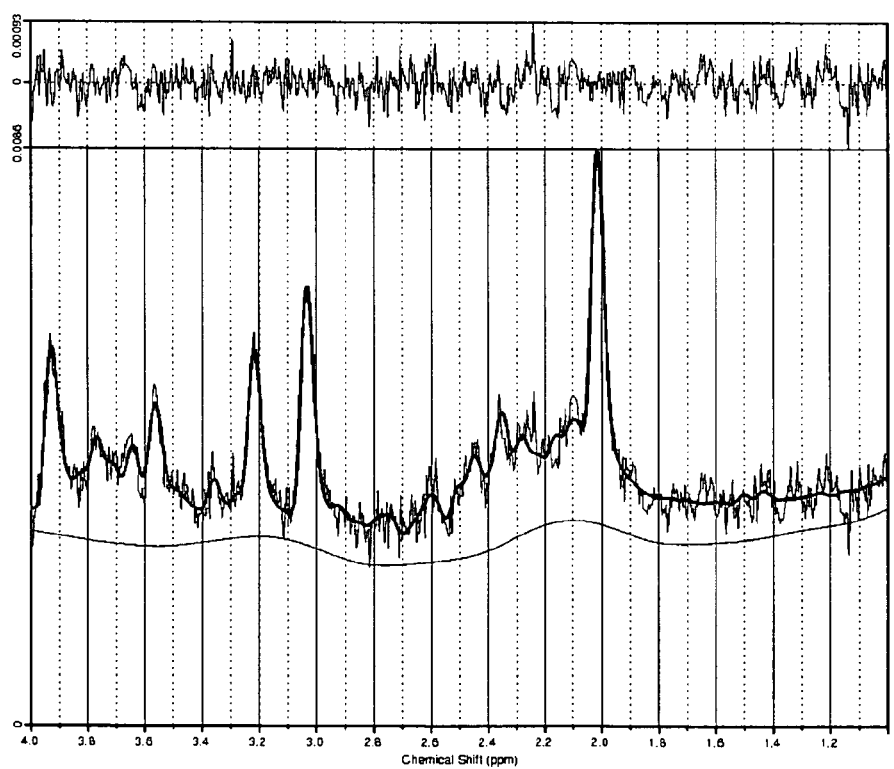

FIG. 4A shows a mosaic display of the 12×12 matrix of spectra obtained after 2:50 min of acquisition; the VOI selected by the PRESS module is highlighted by a box with a broken line. FIGS. 4B and 4C show results of spectra from the central region (indicated by a box with a solid line in FIG. 4A) recorded within the initial 1:01 min and within 5:33 min of signal averaging, respectively. Signals from N-acetyl aspartate, creatine compounds, choline compounds, myoinositol, and glutamate were quantified with Cramer-Rao lower bounds of less than 30% after 1:01 min and less than 17% after 5:33 min of scanning.

Figure 5A:
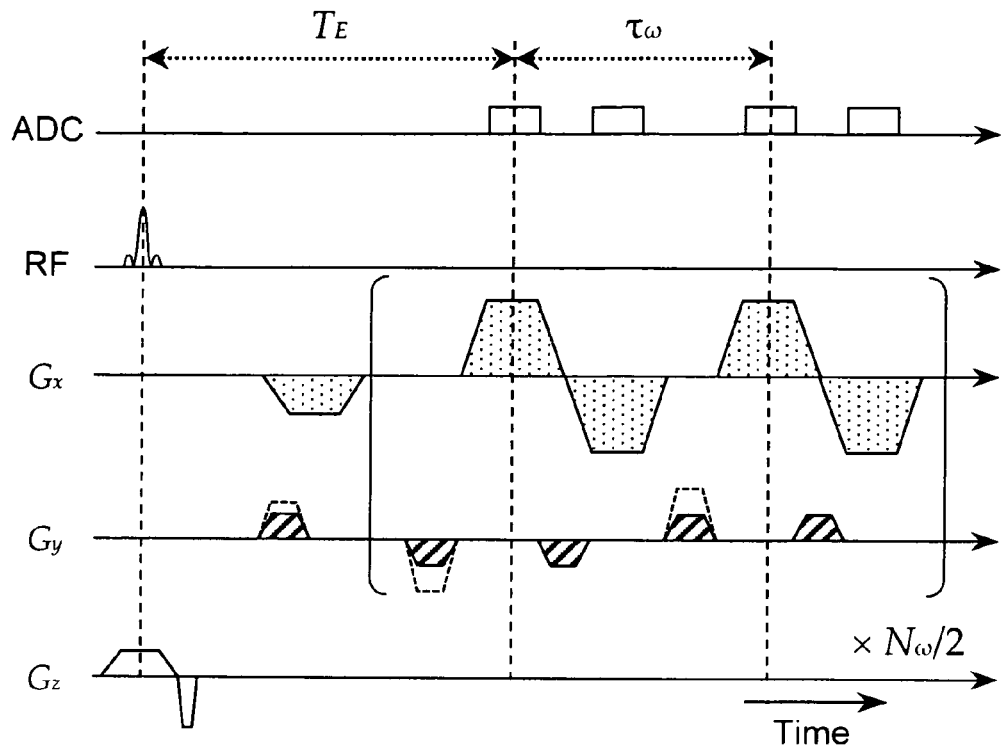
FIG. 5: (A) a further embodiment of an inventive SCEPSIS pulse sequence, corresponding individual k-space trajectories of (B) the first, (C) the second, (D) the third, and (E) the forth shot, and (F) overlay of all k-space trajectories acquired for each spectral dwell time.
Figure 5B:
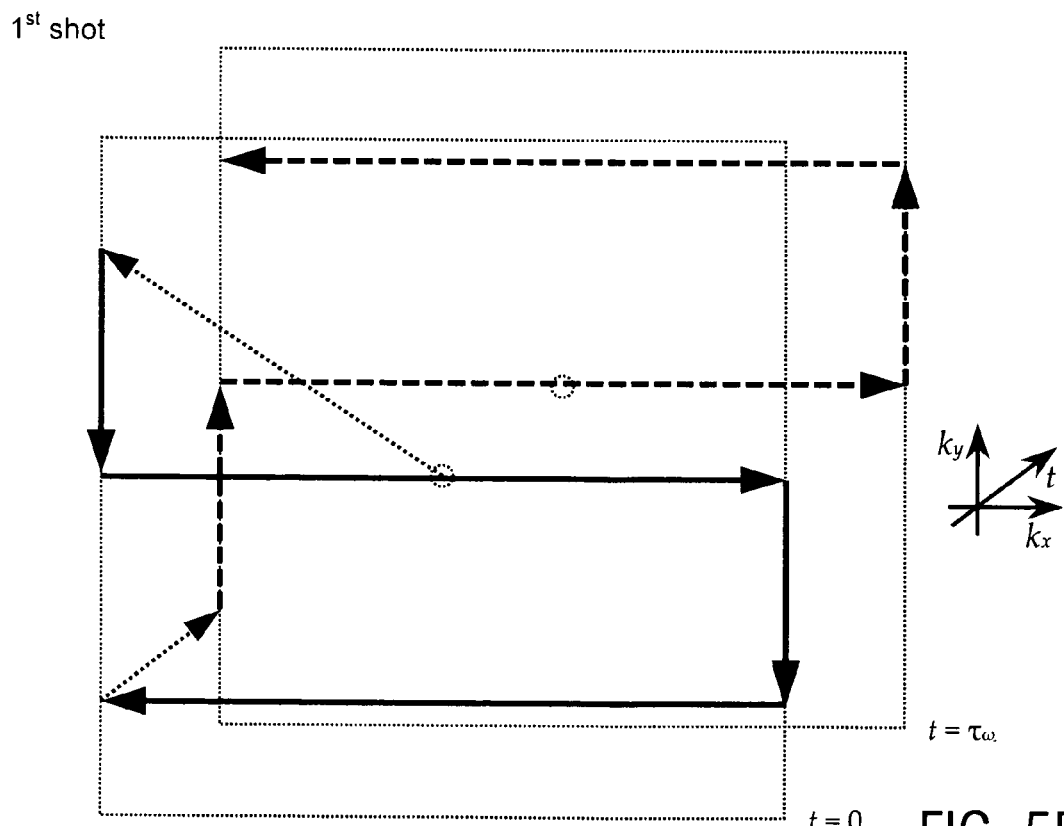
Figure 5C:
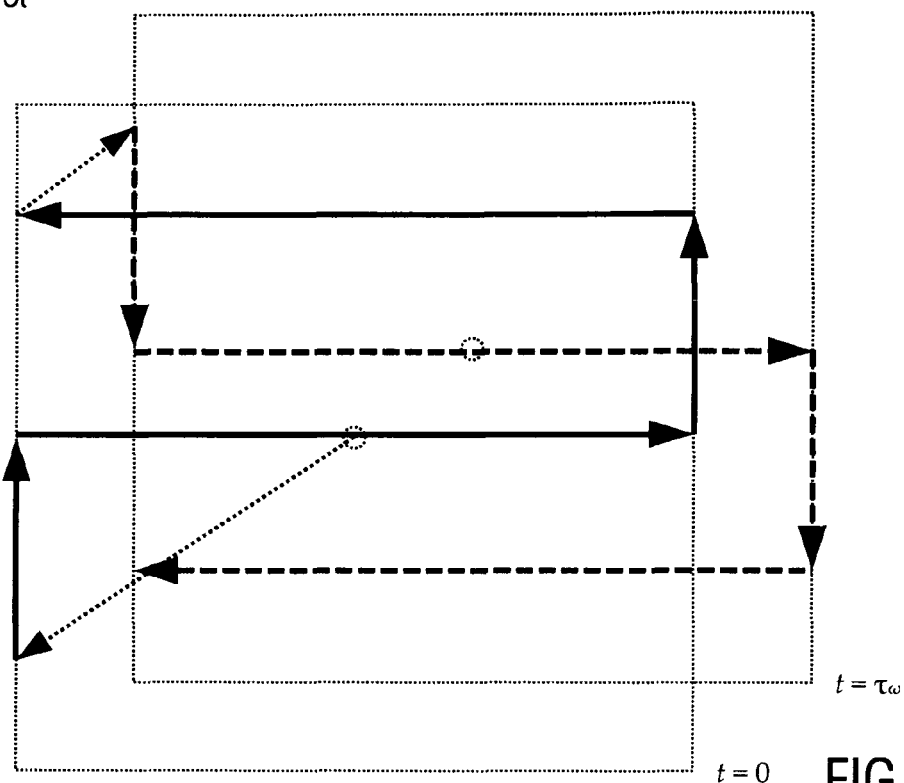
Figure 5D:
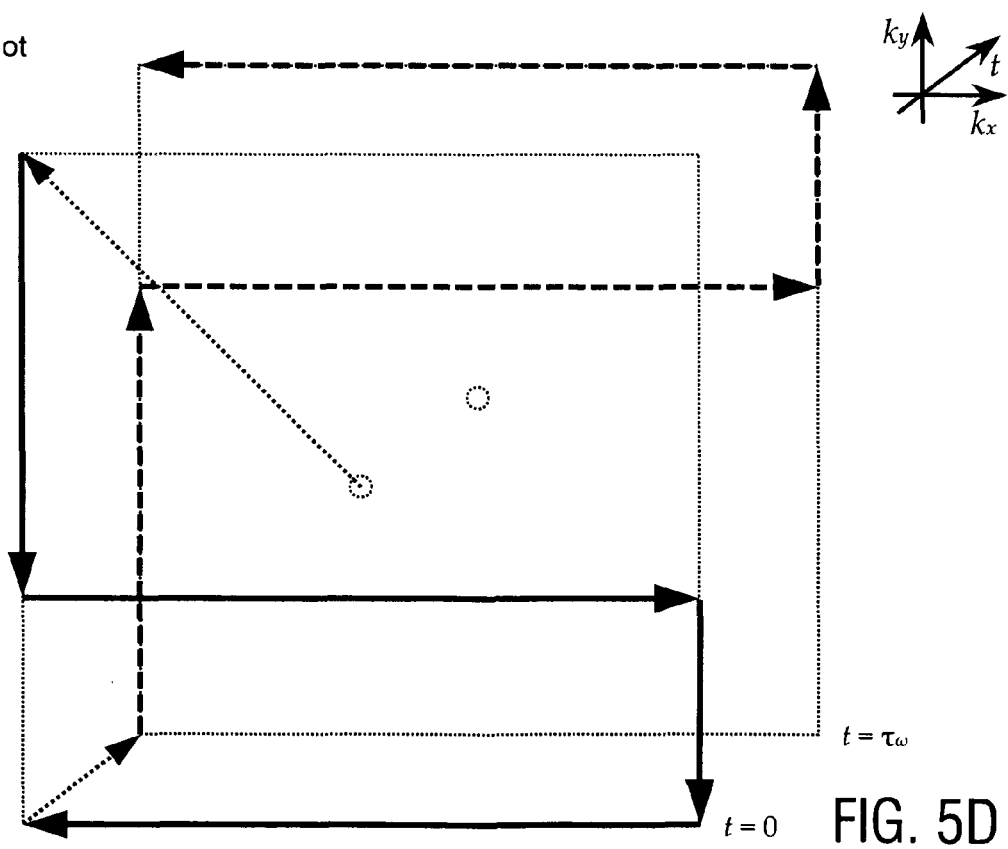
Figure 5E:
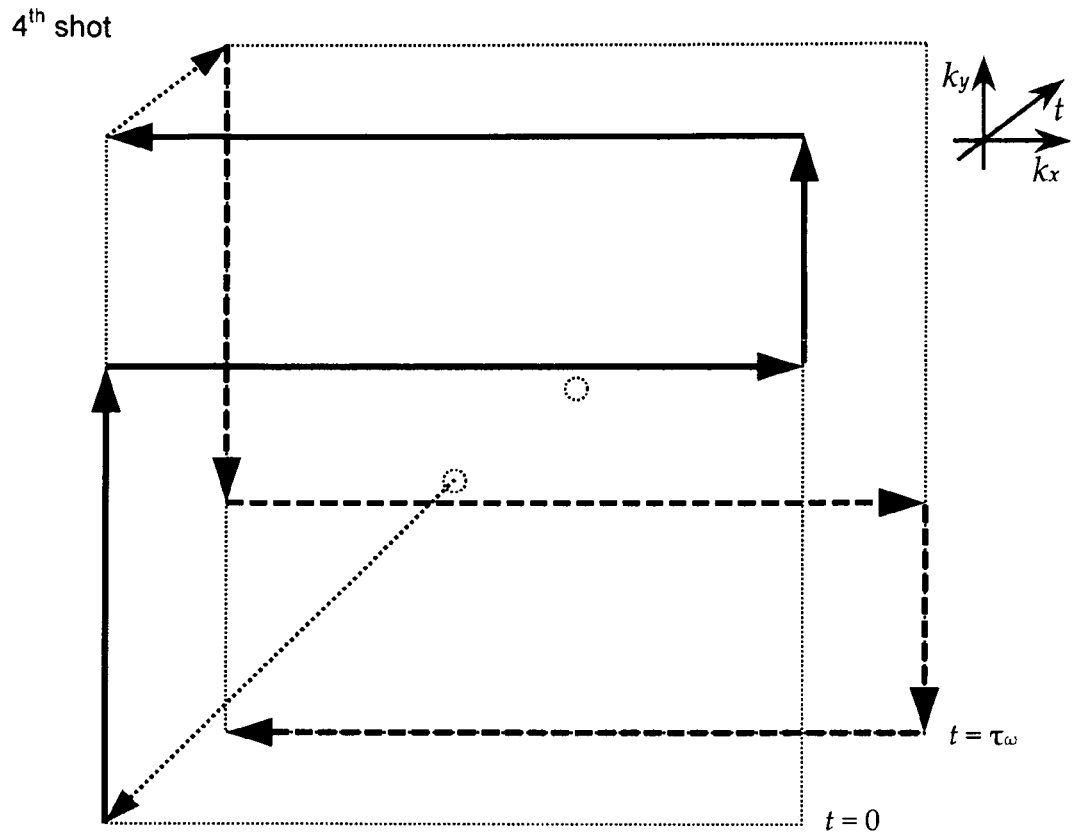
Figure 5F:
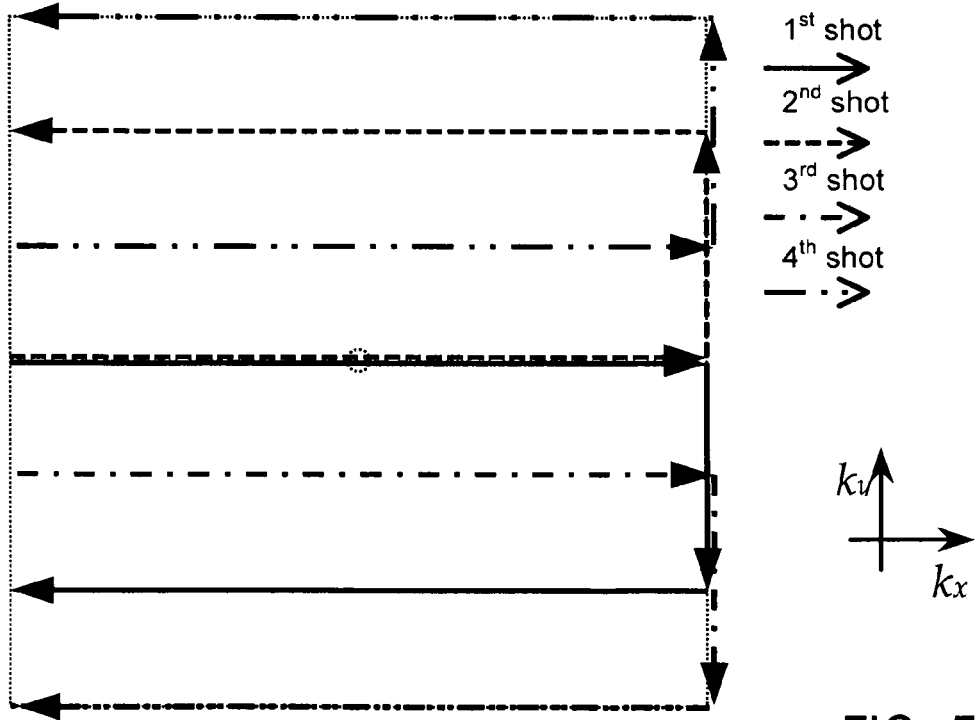

FIG. 5A shows another example of a preferred embodiment of the inventive SCEPSIS technique, in which only a single RF pulse is used in the excitation module to excite the spin system at the $^{31}P$ resonance. In this case, only two echoes and, hence, two k-space lines are collected per spectral dwell time. A total of two first and two second sampling sequences (shots) are thus needed to acquire an 8×7 matrix (reconstructed to 8×8). The corresponding k-space trajectories of each first sampling sequence are shown in FIGS. 5B and 5C, and the corresponding k-space trajectories of each second sampling sequence are shown in FIGS. 5D and 5E. As can be seen in FIG. 5F, acquisition of the individual segments of k-space is performed following trajectories that always start with the innermost lines and proceed towards the edge of k-space in a way that the segments cover k-space in an interleaved fashion.

Parameters for an implementation at approximately 3 T are shown in the last column of Table 1. Besides the alternation of the polarity of phase-encoding blips for every new spectral dwell time, it is also possible to use the same polarity of phase-encoding blips throughout the shot in a similar fashion as shown in FIG. 2. Furthermore, it is also possible to modify the moments of the prephasing gradient along phase-encoding direction and the flyback gradient if it is intended to shift the positions of the k-space lines acquired with the first echo of each spectral dwell time along the phase-encoding direction in a similar fashion as shown in FIG. 3 for the acquisition of an 8×8 matrix instead of an 8×7 matrix.

Figure 6A:
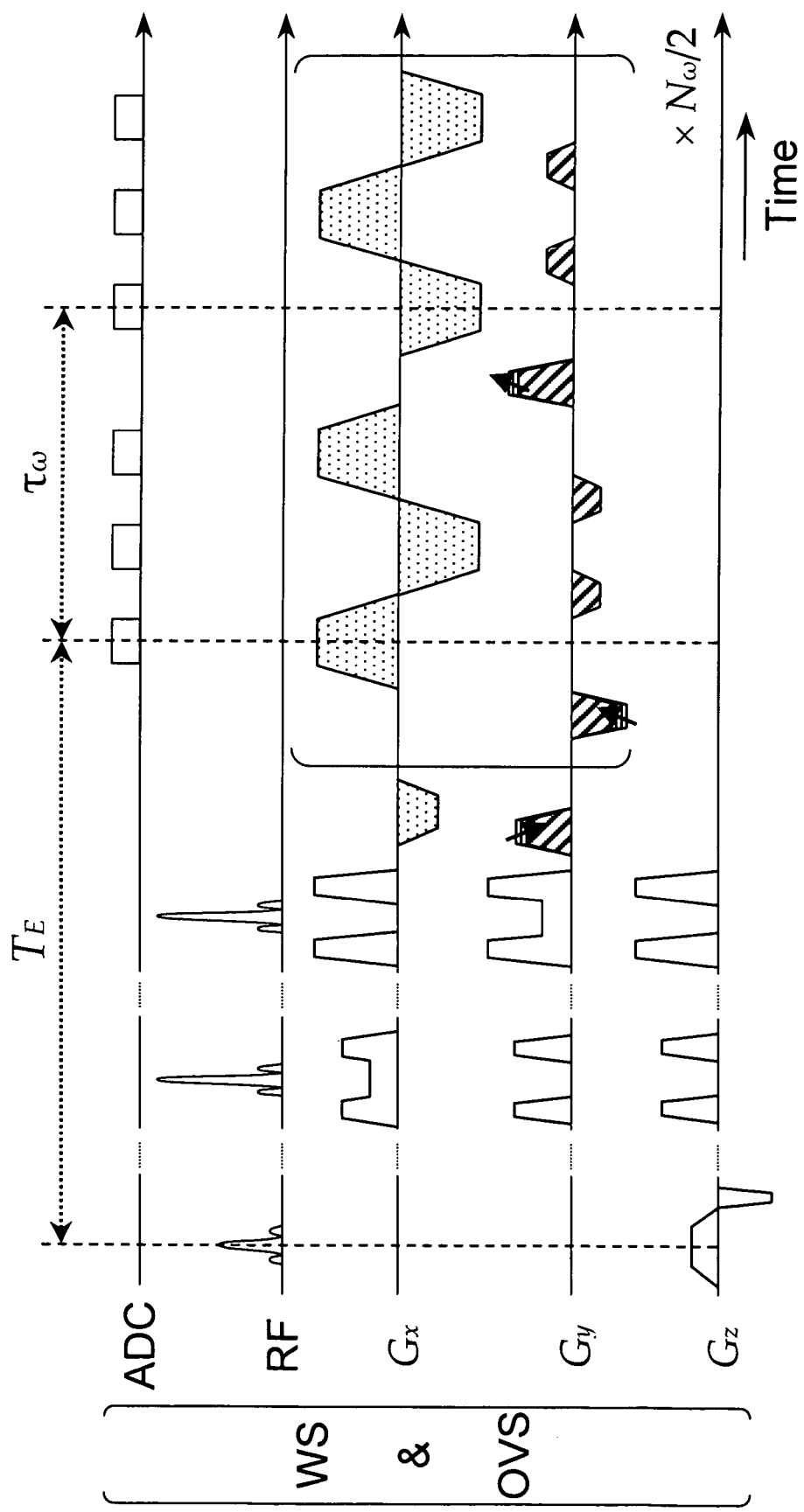
FIG. 6: (A) a further embodiment of an inventive SECPSIS pulse sequence with 16 segments and acquisition of three k-space lines per shot and (B) overlay of all k-space trajectories acquired for each spectral dwell time.
Figure 6B:
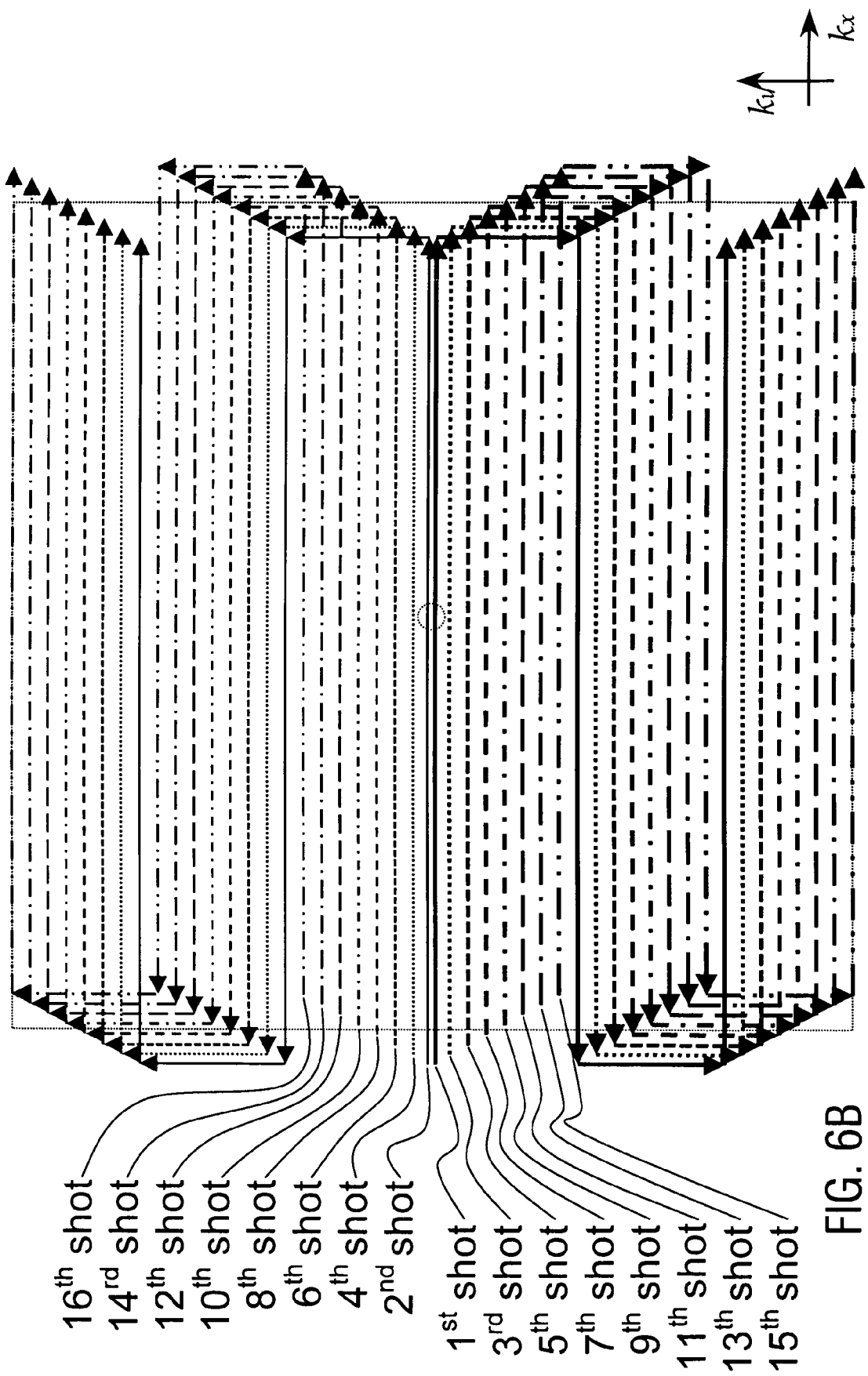

In yet another embodiment as shown in FIG. 6, the number of segments is further increased with $n_{seg}=16$ and $N_y/n_{seg}=3$ for further illustrating the principle of segmentation. FIG. 6A illustrates the first sampling sequences for $^1$H spectroscopic imaging with a PRESS excitation module (as in FIG. 1A) for sampling a 48×47 matrix (reconstructed to 48×48) as outlined in FIG. 6B. Parameters for an implementation at approximately 3 T are given in column five of Table 1. Note that the dotted square in FIG. 6 indicates the borders of the sampled k-space region and that the various k-space trajectories are displayed with a slight shift to the left or right for better visualization of overlapping sections on the right or left border.

In the above mentioned embodiments, the zero-th gradient moments $m_{y,p}$ and $m_{y,f}$ of, respectively, the prephasing gradient $G_{y,p}$ and the flyback gradient $G_{y,f}$ along the phase-encoding direction, which are used to adjust the starting position of the k-space trajectory along the $k_y$-direction at each time point $i_\omega \times \tau_\omega=0, 1, \ldots, N_\omega-1$) and each segment $i_{seg}=1, 2, \ldots, n_{seg}$ can be computed from the following generalized equations:

$$m_{y,p}(i_{seg}) = \frac{2\pi \Delta k_y}{\gamma_A} \left\{ \delta n_p + \frac{\Delta n_y[(-1)^{i_{seg}}-1]}{2} + (-1)^{i_{seg}} a_y \left\{ \frac{N_y}{N_{seg}} - 1 + \left[\text{floor}\left(\frac{i_{seg}}{2}\right) - 1\right]\right\}\right\} \text{ and}$$

Equation 1

$$a_y = 1 \text{ and } m_{y,f}(i_{seg}) = \frac{2\pi \Delta k_y}{\gamma_A} (-1)^{i_{seg}+1} \left(\frac{N_y}{N_{seg}} - 1\right)$$

Equation 2a if the gradient polarity is not altered for odd and even values of $i_\omega$ (i.e. between subsequent dwell times), or $$a_y = -1, \text{ and}$$

Equation 2b $$m_{y,f}(i_{seg}, i_\omega) = \frac{2\pi \Delta k_y}{\gamma_A} (-1)^{i_{seg}+i_\omega} \left\{\frac{N_y}{N_{seg}} - 1 + \Delta n_y + 2\left[\text{floor}\left(\frac{i_{seg}}{2}\right) - 1\right]\right\}$$

if the gradient polarity is altered for odd and even values of $i_\omega$.

In these equations, $\delta n_p$ is an adjustment factor for shifting the k-space trajectory along the phase-encoding direction, $\Delta n_y$ is an integer, which is 0 if the central k-space line is sampled twice or +1 in other cases, $a_y$ is an integer, which is −1 or +1 if the gradient polarity between subsequent dwell times is altered or not altered, respectively, $N_y$ is the number of sampling points in phase-encoding direction, and the floor-function floor(x) is the largest integer not greater than x.

It is to be noted that the specific case shown in FIG. 3B is considered in the above equations by selecting an increment $\delta n_p=+\frac{1}{2}$ to shift the k-space trajectories along the phase-encoding direction.

Figure 7:
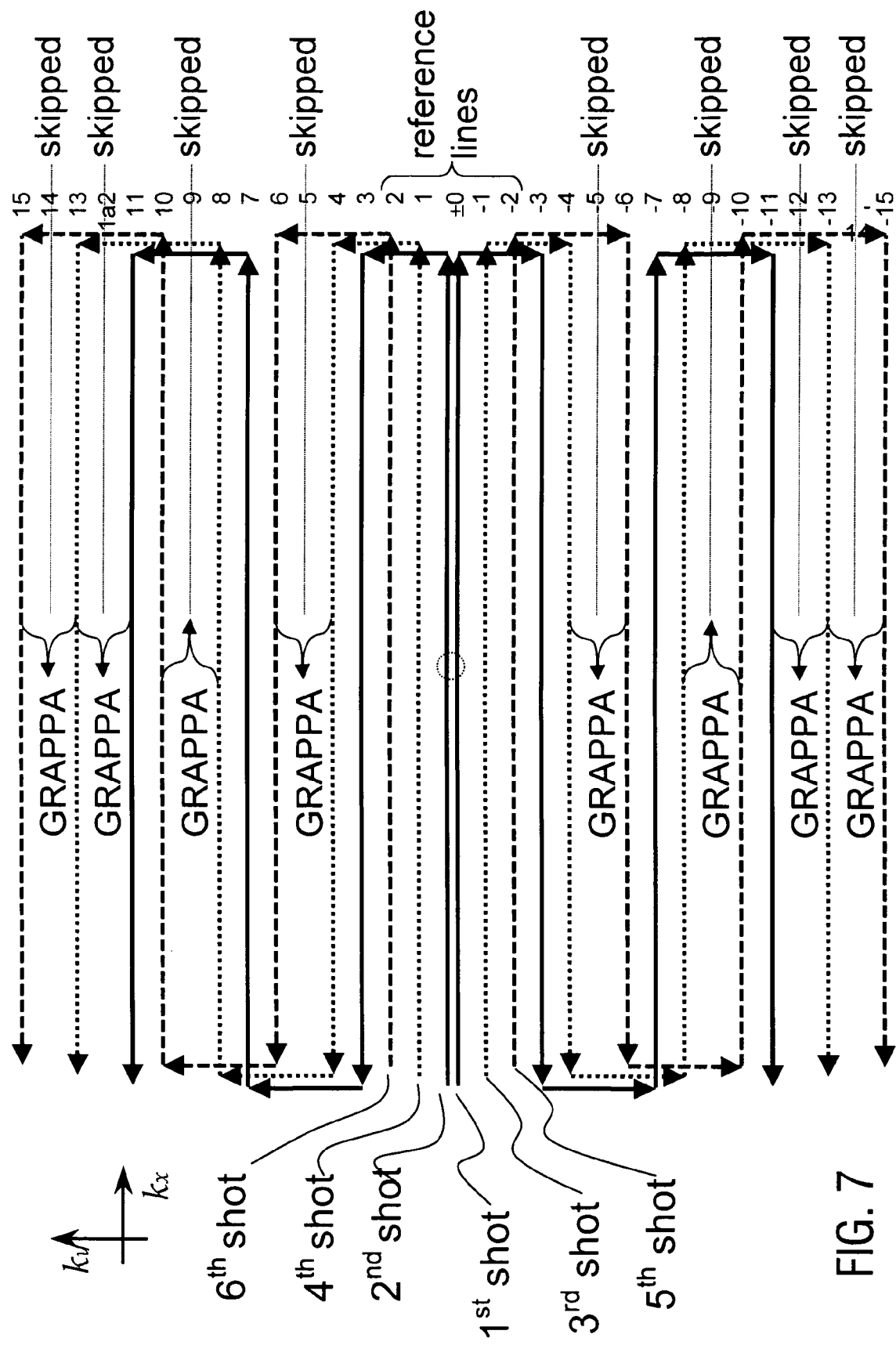
FIG. 7: an overlay of k-space trajectories for a further embodiment of an inventive SCEPSIS pulse sequence combined with partially-parallel imaging.

In yet another embodiment, the inventive SCEPSIS method may be combined with the GRAPPA parallel-imaging technique [27]. For this purpose, signal acquisition is performed with a multiple-channel phased-array coil. Reference lines for GRAPPA reconstruction may be acquired with the spectroscopic imaging scan or with a reference scan without WS. An example is given in FIG. 7 for a 32×31 matrix (reconstructed to 32×32), in which eight k-space lines are skipped resulting in an acceleration from eight to six shots. Five reference lines are acquired in the central region of k-space (lines numbered from −2 to 2 in FIG. 7) and used for the determination of weighting factors for synthesizing the skipped lines. Above and below each skipped k-space line, k-space lines are acquired with the same temporal offset with respect to the first echo and with the same polarity of the read-out gradient lobe; for example, line 5 can be synthesized utilizing the information from lines 4 and 6.

As the Fourier transform of a real object is Hermitian, it is generally known in MRI that the k-space (i.e. the $k_x k_y$-plane in the context considered here) also possesses Hermitian symmetry. This is frequently exploited in MRI for so-called partial k-space acquisitions, that is, only a portion (at least one half) of the k-space data is acquired by the imaging procedure, and the remaining data are computed by application of a suitable symmetry operation. For example, homodyne processing may be used for this purpose [40]. Such strategies may also be combined with the inventive SCEPSIS method. In particular, it is possible to sample $n_{seg}/2$ segments applying $n_{seg}/2$ shots to fill either the upper or lower half of the $k_x k_y$-plane at each spectral dwell time and use homodyne processing or another appropriate processing strategy making use of the Hermitian k-space symmetry to generate the data for the other half of the $k_x k_y$-plane at each spectral dwell time. Such a strategy may be especially useful if a high temporal resolution is required in serial scanning. In this case, an adjustment of $\delta n_p$ may be employed for precisely positioning the central k-space line and correcting for unwanted echo shifts, which may be due to an unfavorable distribution of the magnetic susceptibility across the object or unsuppressed eddy currents.

Figure 8:
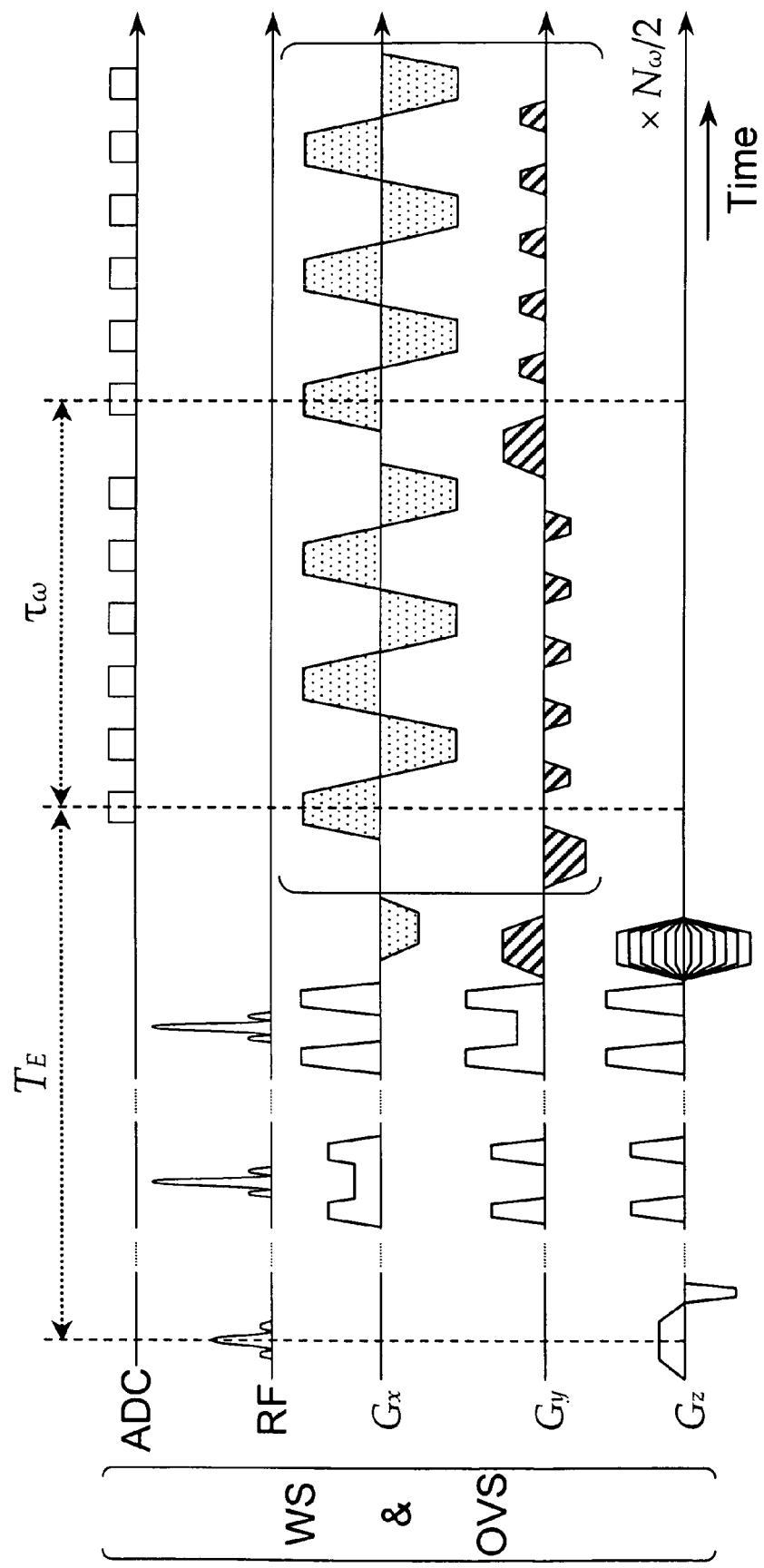
FIG. 8: a further embodiment of an inventive hybrid SCEPSIS pulse sequence combined with a conventional phase-encoding module for spectroscopic acquisition in three spatial dimensions.
Figure 9:
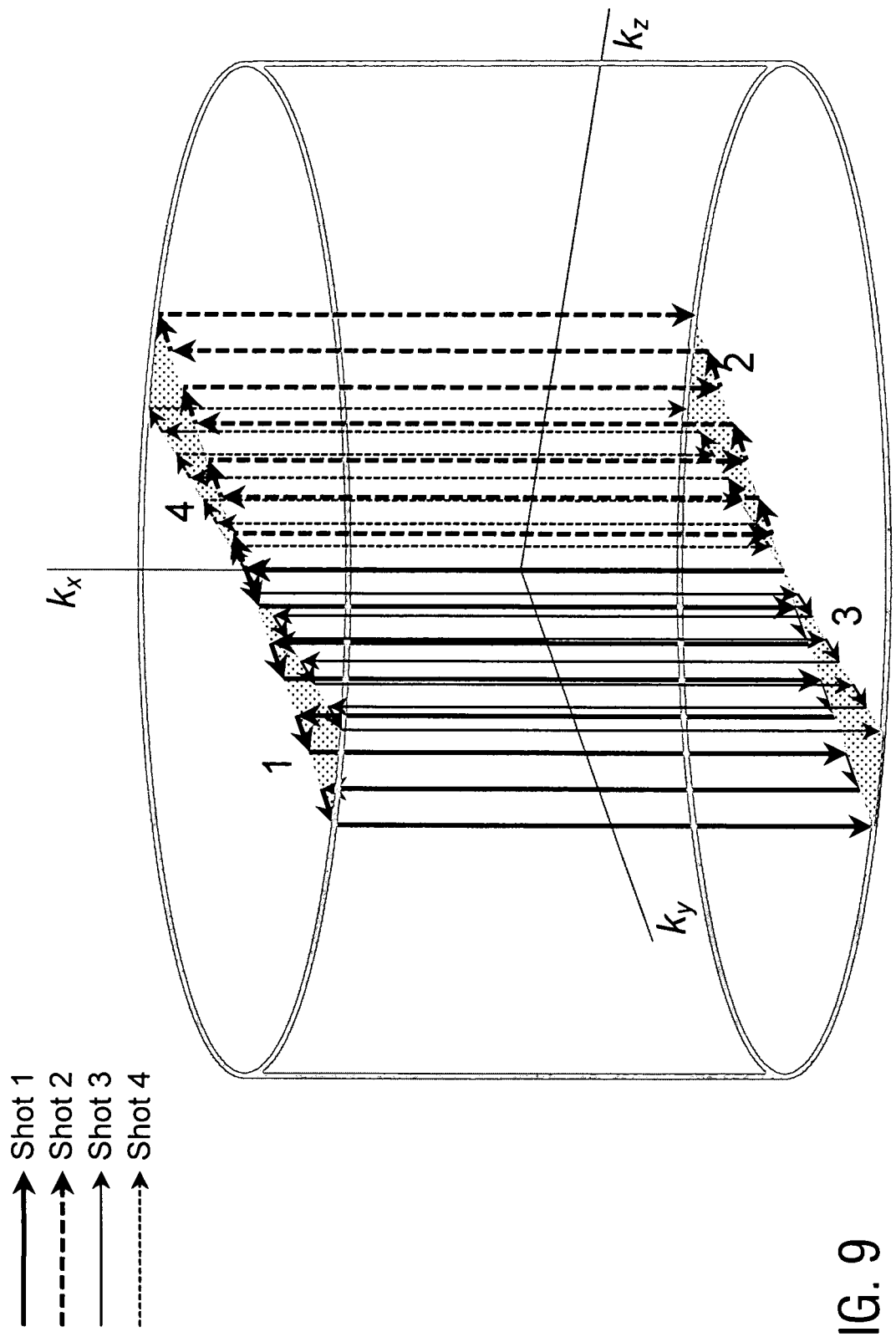
FIG. 9: a further embodiment of an inventive SCEPSIS pulse sequence with a cylindrical sampling strategy for spectroscopic acquisition in three spatial dimensions.

Although the principle of the inventive SCPSIS method can be theoretically extended to three spatial dimensions by adding an EPI-like phase-encoding scheme along the z-axis, it is unlikely to achieve sufficiently short spectral dwell times with currently available gradient hardware and such an implementation. As an alternative, a hybrid SCEPSIS technique can be designed by integrating a conventional phase-encoding module [40] into the scheme as shown in FIG. 8. Another potential embodiment of imaging in three spatial dimensions considers multislice 2D SCEPSIS scanning, that is, excitation and spatial-spectral encoding of further slices through the object under investigation may be performed in the time between the end of the $N_\omega$-th spectral dwell time of one segment and the onset of the subsequent execution of the sequence (i.e. the acquisition of the next segment) in a similar manner as commonly used in multislice 2D MRI [40]. Finally, 3D spatial encoding may also be achieved by rotating the direction of the phase-encoding gradients by an angle $\Delta\phi$ between shots (with either continuously increasing angles or randomly varying angles) to obtain a cylindrical sampling strategy as indicated in FIG. 9.

MR Imaging Device

Figure 10:
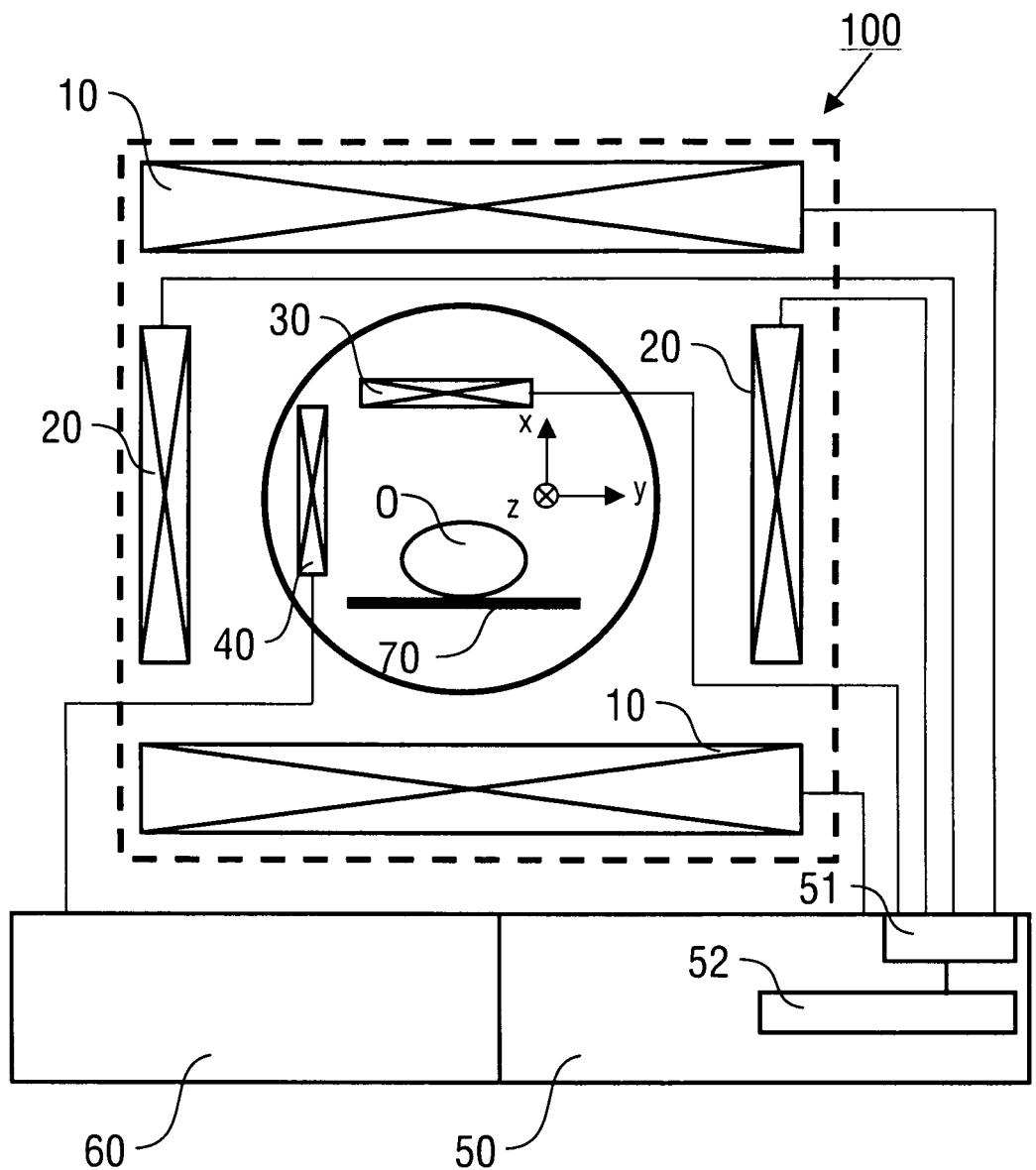
FIG. 10: a schematic illustration of a preferred embodiment of the inventive MR imaging device.

FIG. 10 schematically illustrates an embodiment of the inventive imaging device 100 including a main magnetic device 10 creating a stationary magnetic field, a magnetic field gradient device 20 generating an encoding sequence of magnetic field gradients resulting in k-space sampling according to the inventive SCEPSIS method, a transmitter device 30 creating excitation RF pulses and possibly refocussing RF pulses, a receiver device 40 for collection of the NMR signals created in the object O, a control device 50 controlling the magnetic field gradient device 20 and the transmitter device 30, and an image reconstructing circuit 60 reconstructing a MR image of the object O based on resonance signals collected with the receiver device 40. The components 10-40 and 60 are constructed as it is known from conventional MR scanners. In particular, the components 10 to 40 comprise coils, which are arranged around a space accommodating the object O, which is typically arranged on a carrier 70.

The control device 50 is connected with the coils of the magnetic field gradient device 20 and the transmitter device 30.

The control device 50 includes an electrical circuit 51, which is adapted for creating the inventive SCEPSIS pulse sequence, possibly including the preparation step. Furthermore, the control device 50 may include a setting device 52, which is adapted for selecting operation parameters of the inventive SCEPSIS pulse sequence and/or the type of preparation.

The features of the invention disclosed in the above description, the drawings and the claims can be of significance both individually as well as in combination for the realization of the invention in its various embodiments.

ABBREVIATIONS AND MATHEMATICAL SYMBOLS

1D=one-dimensional; 2D=two-dimensional; 3D=three-dimensional; ADC=analog-to-digital converter; ATP=adenosine triphosphate; CHESS=chemical-shift selective; CSI=chemical shift imaging; DEPICTING=double-shot echo-planar imaging with center-out trajectories and intrinsic navigation; EPSI=echo planar spectroscopic imaging; EPSM=echo-planar shift mapping; FOV=field of view; GRAPPA=generalized autocalibrating partially parallel acquisitions; LSEPSI=line-scan echo-planar spectroscopic imaging; MR=magnetic resonance; MRI=magnetic resonance imaging; MRS=magnetic resonance spectroscopy; MRSI=magnetic resonance spectroscopic imaging; NMR=nuclear magnetic resonance; OVS=outer volume suppression; PEEP=phase-encoded echo planar; PEPSI=proton echo-planar spectroscopic imaging; PREP=projection-reconstruction echo planar; PRESS=point-resolved spectroscopy; RF=radiofrequency; SCEPSIS=segmental center-out echo-planar spectroscopic imaging sequence; SENSE=sensitivity encoding; SNR=signal-to-noise ratio; STEAM=stimulated echo acquisition mode; VOI=volume of interest; voxel=volume element; WS=water suppression.

$a_y$ integer indicating whether the gradient polarity is altered ($a_y=-1$) or not altered ($a_y=+1$) between subsequent dwell times.
$B_0$ magnitude of the static magnetic field
$G_x$, $G_y$, $G_z$, magnetic field gradient amplitudes
$i_{seg}$ segment number (i.e. an integer running from 1 to $n_{seg}$)
$i_\omega$ integer running from 0 to $N_\omega-1$
$k_x$, $k_y$ spatial k-space coordinates
$k_\omega$ spectral k-space coordinate
$m_{y,f}$ zero-th moment of the flyback gradient along phase-encoding direction
$m_{Y,p}$ zero-th moment of the prephasing gradient along phase-encoding direction
$N_x$, $N_y$ number of sampling points in x- and y-directions
$N_\omega$ number of sampling points along the t-axis ("dwell-time samplings")
$n_{seg}$ number of segments
$T_2$ transverse relaxation time
$T_{delay}$ delay time
$T_E$ echo time
$T_R$ repetition time
t time
$t_D$ delay time
x, y, z Cartesian coordinates
$Z_0$ slice position
$\alpha$ RF pulse flip angle
$\gamma_A$, $\gamma_B$ magnetogyric ratios of nuclei A and B
$\Delta k_x$, $\Delta k_y$ separation of adjacent k-space points along $k_x$ and $k_y$-direction
$\Delta n_y$ integer indicating whether the central k-space line is sampled twice ($\Delta n_y=0$) or only once ($\Delta n_y=1$)
$\Delta t_x$, $\Delta t_y$ modulation periods of x- and y-gradients
$\Delta z$ slice thickness
$\Delta\phi$ angle increment
$\Delta\nu$ spectral bandwidth
$\delta n_p$ adjustment factor for shifting the k-space trajectory along the direction of phase encoding
$\tau_\omega$ spectral dwell time
$\omega$ angular frequency

The invention claimed is:

1. A method of magnetic resonance spectroscopic imaging of an object, said object including at least one chemical species to be imaged, which chemical species has magnetic resonance signals of nuclei with a magnetogyric ratio $\gamma_A$ within a specific spectral bandwidth, said method comprising the steps of:

arranging the object in a stationary magnetic field;
subjecting the object to a plurality of first sampling sequences with an excitation sequence and an encoding sequence of phase-encoding and read-out gradients resulting in a sampling of a plurality of k-space segments of the k-space and covering the k-space in an interleaved fashion, such that a plurality of $N_\omega$ first sampling trajectories through at least one k-space segment of the k-space is formed along a phase-encoding direction, each of said first sampling trajectories beginning in a central k-space region and continuing to a k-space border of the at least one k-space segment and having a duration equal to or below a spectral dwell time corresponding to a reciprocal spectral bandwidth;
collecting at least one first set of gradient-echo signals obtained along said first sampling trajectories;
collecting at least one second set of gradient-echo signals obtained along a plurality of $N_\omega$ second sampling trajectories, said $N_\omega$ second sampling trajectories and said $N_\omega$ first sampling trajectories being mutually mirrored relative to a predetermined k-space line in the central k-space region; and
reconstructing a spectrally resolved image of the object based on the collected gradient-echo signals,
wherein a flyback gradient pulse is used for rewinding the k-space trajectories after reaching the k-space border and before starting a next k-space trajectory of a subsequent spectral dwell time from an intended position in k-space.

2. A method according to claim 1, wherein said at least one second set of gradient-echo signals is:
collected by subjecting the object to at least one second sampling sequence with an excitation sequence and an encoding sequence of phase-encoding and read-out gradients resulting in a sampling of the k-space such that said plurality of $N_\omega$ second sampling trajectories through at least one k-space segment of the k-space is formed along the phase-encoding direction, each of said second sampling trajectories beginning at a central k-space region and continuing to a k-space border of the at least one k-space segment and having a duration equal to or below a spectral dwell time corresponding to the reciprocal spectral bandwidth, or
computed from the at least one first set of gradient-echo signals using a Hermitian symmetry of the k-space.

3. A method according to claim 1, wherein
the $N_\omega$ first sampling trajectories subsequently cover at least two different k-space segments in opposite halves of the k-space with cyclic permutations, and
the $N_\omega$ second sampling trajectories subsequently cover the at least two different k-space segments with reversed polarity.

4. A method according to claim 1, wherein
the $N_\omega$ first sampling trajectories subsequently cover a first one of two different k-space segments, and
the $N_\omega$ second sampling trajectories subsequently cover a second one of the two different k-space segments with reversed polarity.

5. A method according to claim 1, wherein
at least one of the first sampling trajectories begins at a central k-space line and the second sampling trajectories are mirror images of the first sampling trajectories with a reflection axis being the $k_x$-axis, or
at least one of the first sampling trajectories begins at a central k-space line and the second sampling trajectories are mirror images of the first sampling trajectories with the reflection axis being parallel to the $k_x$-axis shifted by an amount of $\Delta k_y/2$, or
at least one of the first sampling trajectories begins with a distance of $-\Delta k_y/2$ from the $k_x$-axis and the second sampling trajectories are mirror images of the first sampling trajectories with the reflection axis being the $k_x$-axis.

6. A method according to claim 5, further comprising the steps of:
averaging the gradient-echo signals collected along the common central k-space line yielding common central k-space line signals, wherein
the spectrally resolved image of the object is reconstructed from data in the k-space segments utilizing the common central k-space line signals.

7. A method according to claim 1, wherein
the first and second sampling trajectories spare predetermined reference lines in the k-space, and
reference echo signals along the reference lines are additionally collected with a multi-channel phased-array coil.

8. A method according to claim 1, wherein a 3D encoding of the object is obtained by collecting the gradient-echo signals and reconstructing the spectrally resolved image of the object with
a plurality of planar slices through the object, or
preceding the plurality of first sampling sequences with a phase-encoding step in a third direction, or
repeating the steps of k-space sampling with changing a direction of the phase-encoding gradients by a rotation angle $\Delta\phi$.

9. A method according to claim 1, wherein the excitation sequence is combined with at least one of an outer-volume suppression module, a water-suppression and a solvent-suppression module.

10. A method according to claim 1, further comprising a preparation step including
subjecting the object to at least one radiofrequency preparation pulse, and
conducting each or all of the excitation and encoding sequences after a predetermined magnetization-recovery delay time $T_{delay}$ relative to the at least one preparation pulse.

11. A method according to claim 1, further comprising the step of subjecting one of the first and second sets of gradient-echo signals to a phase correction using an inter-segment phase correction.

12. A method of magnetic resonance spectroscopic imaging of an object, said object including at least one chemical species to be imaged, which chemical species has magnetic resonance signals of nuclei with a magnetogyric ratio $\gamma_A$ within a specific spectral bandwidth, said method comprising the steps of:
arranging the object in a stationary magnetic field;
subjecting the object to at least one first sampling sequence with an excitation sequence and an encoding sequence of phase-encoding and read-out gradients resulting in a sampling of the k-space such that a plurality of $N_\omega$ first sampling trajectories through at least one k-space segment of the k-space is formed along a phase-encoding direction, each of said first sampling trajectories beginning in a central k-space region and continuing to a k-space border of the at least one k-space segment and having a duration equal to or below a spectral dwell time corresponding to a reciprocal spectral bandwidth;
collecting at least one first set of gradient-echo signals obtained along said first sampling trajectories;
collecting at least one second set of gradient-echo signals obtained along plurality of $N_\omega$ second sampling trajectories, said $N_\omega$ second sampling trajectories and said $N_\omega$ first sampling trajectories being mutually mirrored relative to a predetermined k-space line in the central k-space region; and
reconstructing a spectrally resolved image of the object based on the collected gradient-echo signals,
wherein the object includes at least one reference chemical species with a singlet magnetic resonance signal of nuclei with a magnetogyric ratio $\gamma_B$, said method comprising the step of subjecting one of the first and second sets of gradient-echo signals to a phase correction using a separate reference scan with an excitation frequency adjusted to a resonance position of the at least one reference chemical species.

13. A method according to claim 12, wherein the nuclei in the chemical species to be imaged and the nuclei in the reference chemical species are identical.

14. A method according to claim 12, wherein
the magnetogyric ratio $\gamma_A$ of nuclei in the chemical species to be imaged and the magnetogyric ratio $\gamma_B$ of nuclei in the reference chemical species with a singlet magnetic resonance signal is different, and
the phase correction is adjusted by taking into account a ratio $\gamma_A/\gamma_B$ of the respective magnetogyric ratios.

15. A method according to claim 1, wherein an additional prephasing gradient is applied for correcting unwanted echo shifts along the direction of phase encoding, which may be due to a variation of magnetic susceptibility across the object or unsuppressed eddy currents.

16. A method according to claim 1, wherein an observed nucleus of said chemical species is one of $^1$H, $^2$H, $^3$He, $^6$Li, $^7$Li, $^{13}$C, $^{14}$N, $^{15}$N, $^{17}$O, $^{19}$F, $^{23}$Na, $^{29}$Si, $^{31}$P, $^{39}$K, $^{57}$Fe, $^{59}$Co, $^{129}$Xe, and $^{133}$Cs.

17. An imaging device being configured for magnetic resonance spectroscopic imaging of an object with a method according to claim 1, comprising:
- a main magnetic device arranged for creating a stationary magnetic field;
- a gradient device arranged for generating a plurality of sampling sequences;
- a transmitter device arranged for creating excitation pulses;
- a receiver device arranged for collecting the first and second sets of gradient echo signals;
- a control device arranged for controlling the gradient device and the transmitter device, the control device being adapted for creating the plurality of sampling sequences, and
- an image reconstructing circuit arranged for reconstructing an image of the object based on the first and second sets of gradient echo signals.

* * * * *